United States Patent
Yoshida

(10) Patent No.: US 10,364,510 B2
(45) Date of Patent: Jul. 30, 2019

(54) SUBSTRATE FOR CRYSTAL GROWTH HAVING A PLURALITY OF GROUP III NITRIDE SEED CRYSTALS ARRANGED IN A DISC SHAPE

(71) Applicants: SCIOCS COMPANY LIMITED, Hitachi-shi, Ibaraki (JP); SUMITOMO CHEMICAL COMPANY, LIMITED, Tokyo (JP)

(72) Inventor: Tekehiro Yoshida, Hitachi (JP)

(73) Assignees: SCIOCS COMPANY LIMITED, Hitachi-Shi, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/361,226

(22) Filed: Nov. 25, 2016

(65) Prior Publication Data

US 2017/0145591 A1    May 25, 2017

(30) Foreign Application Priority Data

Nov. 25, 2015  (JP) ................................ 2015-229973
Nov. 25, 2016  (JP) ................................ 2016-229163

(51) Int. Cl.
   *C30B 29/40*  (2006.01)
   *C30B 25/20*  (2006.01)

(52) U.S. Cl.
   CPC ............ *C30B 25/20* (2013.01); *C30B 29/406* (2013.01)

(58) Field of Classification Search
   CPC ........... C30B 7/00; C30B 7/005; C30B 11/00; C30B 11/14; C30B 19/00; C30B 19/12;
   (Continued)

(56) References Cited

U.S. PATENT DOCUMENTS 6,399,463 B1 * 6/2002 Glenn ................. H01L 21/3043
                                                257/E21.238
2004/0187766 A1 * 9/2004 Letertre .................. C30B 25/02
                                                117/11
(Continued)

FOREIGN PATENT DOCUMENTS

JP    11-268989    * 10/1999
JP    11-268989 A    10/1999
(Continued)

OTHER PUBLICATIONS

Horikiri, "Reducing Initial Failures in GaN-on-GaN Vertical Diodes," Compound Semiconductor, Nov./Dec. 2016, pp. 48-52.
(Continued)

*Primary Examiner* — Kenneth A Bratland, Jr.
(74) *Attorney, Agent, or Firm* — Birch, Stewart, Kolasch & Birch, LLP

(57) ABSTRACT

There is provided a substrate for crystal growth used for a vapor phase growth of a crystal, wherein a plurality of seed crystal substrates made of a group III nitride crystal are arranged in a disc shape, so that their main surfaces are parallel to each other and adjacent lateral surfaces are in contact with each other; and the plurality of seed crystal substrates constituting at least a portion other than a peripheral portion of the substrate for crystal growth respectively has a main surface whose planar shape is a regular hexagon, and a honeycomb pattern obtained by matching the seed crystal substrates has two or more symmetries, when the substrate for crystal growth is rotated once, with an axis passing through a center of a main surface of the substrate for crystal growth and orthogonal to the main surface as a central axis.

12 Claims, 14 Drawing Sheets

(58) Field of Classification Search
CPC ......... C30B 25/00; C30B 25/02; C30B 25/18; C30B 25/20; C30B 29/00; C30B 29/10; C30B 29/40; C30B 29/403; C30B 29/406
USPC ... 117/11, 53, 63, 68, 73, 81, 83–84, 88, 94, 117/101, 103–104, 106, 108, 923, 937, 117/952; 257/613, 615
See application file for complete search history.

(56) References Cited

U.S. PATENT DOCUMENTS

| | | | |
|---|---|---|---|
| 2005/0263854 A1* | 12/2005 | Shelton | B23K 26/40 257/615 |
| 2006/0226414 A1 | 10/2006 | Oshima | |
| 2007/0141814 A1* | 6/2007 | Leibiger | C30B 23/02 438/483 |
| 2009/0085165 A1* | 4/2009 | Hiramatsu | H01L 21/0237 257/615 |
| 2009/0194848 A1 | 8/2009 | Uemura et al. | |
| 2009/0236694 A1 | 9/2009 | Mizuhara et al. | |
| 2011/0088612 A1* | 4/2011 | Ishihara | C30B 23/00 117/9 |
| 2011/0260295 A1 | 10/2011 | Hirota et al. | |
| 2012/0000415 A1* | 1/2012 | D'Evelyn | C30B 25/02 117/94 |
| 2012/0112320 A1 | 5/2012 | Kubo et al. | |
| 2015/0008563 A1 | 1/2015 | Mizuhara et al. | |
| 2015/0203991 A1 | 7/2015 | Hashimoto et al. | |
| 2017/0191186 A1* | 7/2017 | Mori | C30B 25/186 |
| 2017/0314157 A1* | 11/2017 | Mori | C30B 29/406 |

FOREIGN PATENT DOCUMENTS

| | | |
|---|---|---|
| JP | 2006-290676 A | 10/2006 |
| JP | 2006-315947 A | 11/2006 |
| JP | 2008-133151 A | 6/2008 |
| JP | 2008-143772 A | 6/2008 |
| JP | 2011-63504 A | 3/2011 |
| JP | 2012-1432 A | 1/2012 |
| JP | 2012-31028 A | 2/2012 |
| JP | 2012-56799 A | 3/2012 |
| JP | 2012-197190 A | 10/2012 |
| JP | 2013-230971 A | 11/2013 |
| JP | 2014-47097 A | 3/2014 |
| JP | 2015-224143 A | 12/2015 |

OTHER PUBLICATIONS

Imanishi et al., "Na-flux Growth on the Tiling HVPE Wafer for the Suppression of V-shape Valley Formation at the Coalescence Boundary," IWN, Oct. 5, 2016, 2 pages.

Imanishi et al., "Suppression of V-Shape Valley Formation at the Coalescence Boundary in 4-Inch GaN Crystals Grown from Multiple HVPE Wafers by the Na-Flux Growth," ICCGE-18, Aug. 11, 2016, 1 page.

Kitamura et al., "Study of Manufacturing Process for Free-standing GaN Substrates Grown by HVPE Method with Hybrid Tiling Technique," IWN, Oct. 3, 2016, 2 pages.

Yoshida et al., "Development of GaN Substrate with Large Diameter and Low Orientation Deviation," ICCGE-18, Aug. 7-12, 2016, 1 page.

Yoshida et al., "Development of GaN Substrate with Large Diameter and Low Orientation Deviation," IWN, Oct. 3, 2016, 2 pages.

U.S. Office Action dated Dec. 17, 2018, for Copending U.S. Appl. No. 15/584,756.

* cited by examiner

FIG. 3A
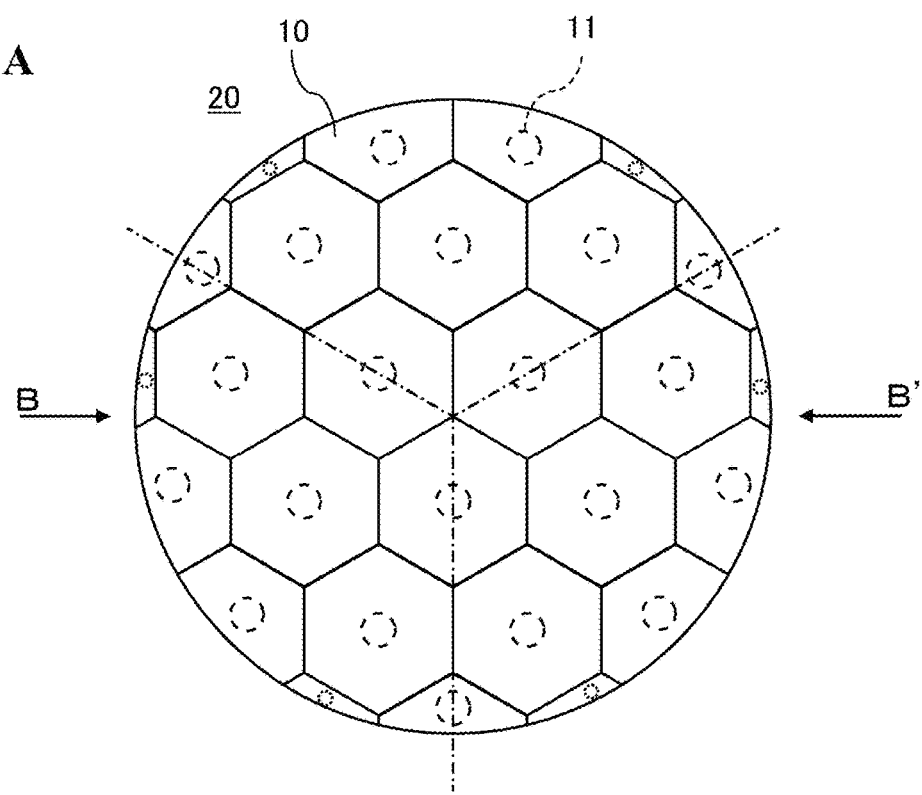
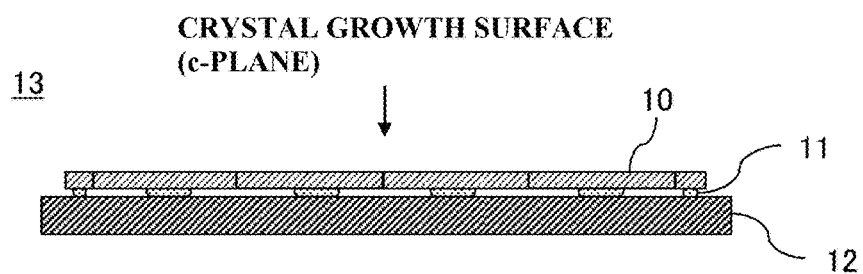
FIG. 3B

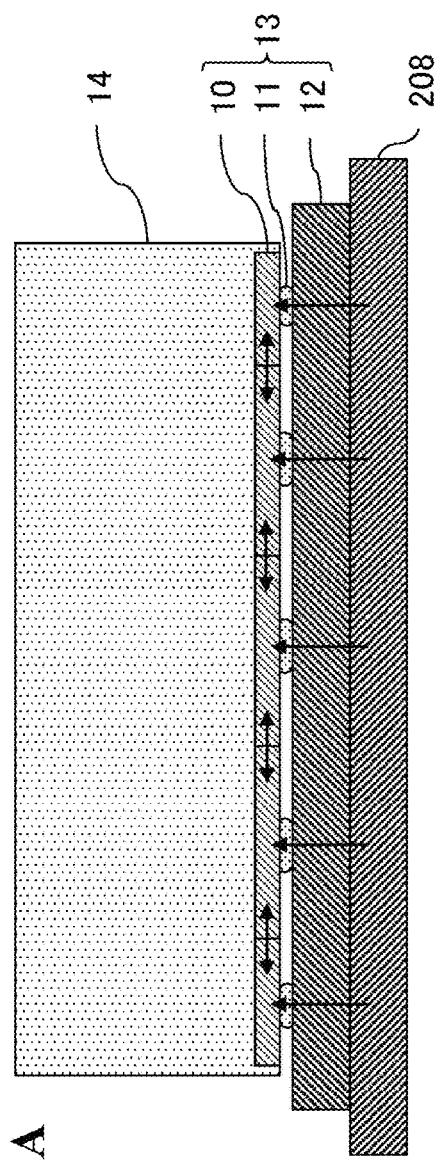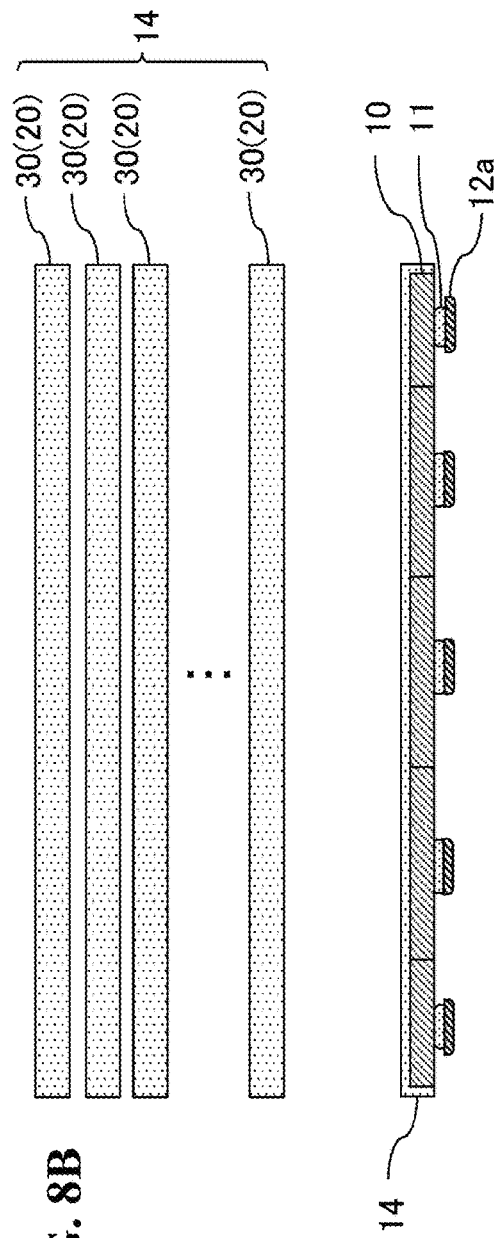

30 (20)

FIG. 11A 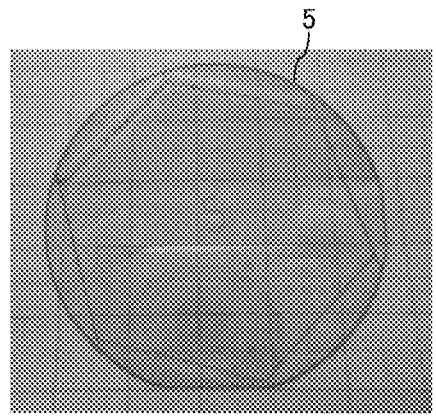 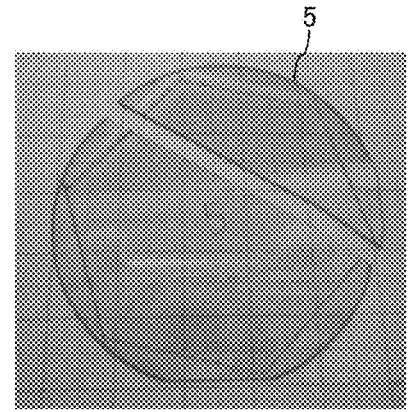
FIG. 11B 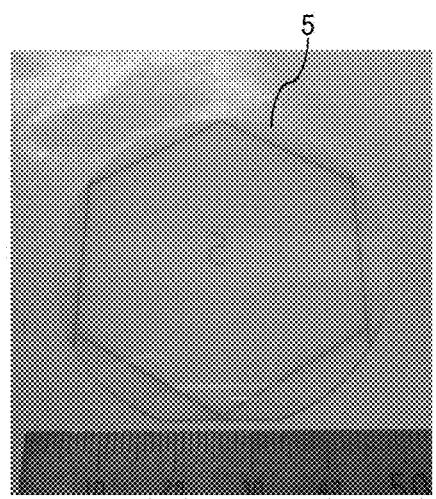 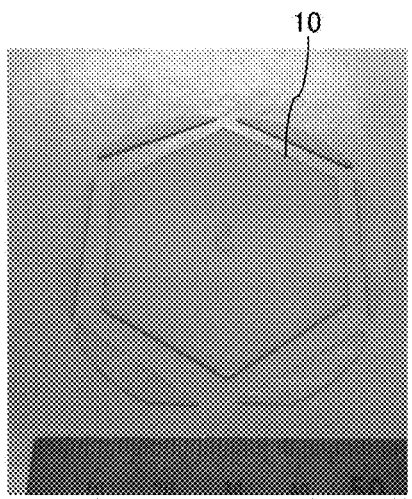
FIG. 11C 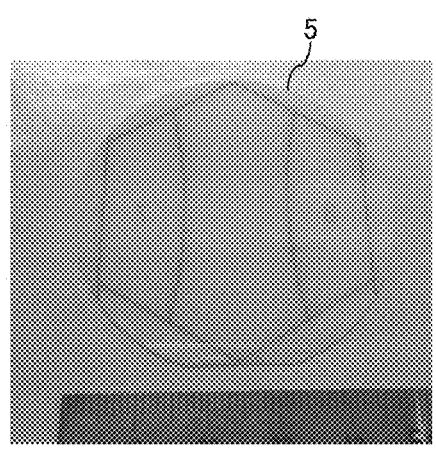 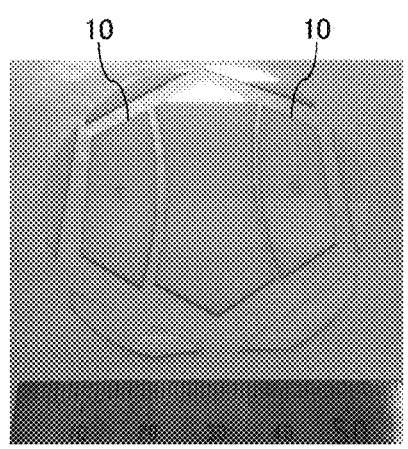

SUBSTRATE FOR CRYSTAL GROWTH HAVING A PLURALITY OF GROUP III NITRIDE SEED CRYSTALS ARRANGED IN A DISC SHAPE

BACKGROUND

Technical Field

The present invention relates to a substrate for crystal growth, a nitride crystal substrate and a manufacturing method of the same.

Description of the Related Art

A substrate made of a nitride crystal such as gallium nitride for example (referred to as a nitride crystal substrate hereafter), is used when manufacturing a semiconductor device such as a light-emitting element and a high-speed transistor, etc. The nitride crystal substrate can be manufactured through the step of growing nitride crystals on a sapphire substrate or a substrate for crystal growth which is prepared using the sapphire substrate. In recent years, in order to obtain a nitride crystal substrate with a large diameter exceeding, for example, 2 inches, there is an increasing need for obtaining a substrate for crystal growth with a larger diameter (for example, see patent document 1).
Patent document 1: Japanese Patent Laid Open Publication No. 2006-290676

SUMMARY OF THE INVENTION

An object of the present invention is to provide a technique of increasing a diameter of a substrate for crystal growth, and manufacturing a high-quality nitride crystal substrate using such a large diameter substrate for crystal growth.

According to an aspect of the present invention, there is provided a substrate for crystal growth used for a vapor phase growth of a crystal, and a related technique thereof,
wherein a plurality of seed crystal substrates made of a group III nitride crystal are arranged in a disc shape, so that their main surfaces are parallel to each other and adjacent lateral surfaces are in contact with each other; and
the plurality of seed crystal substrates constituting at least a portion other than a peripheral portion of the substrate for crystal growth respectively has a main surface whose planar shape is a regular hexagon, and
a honeycomb pattern obtained by matching the seed crystal substrates has two or more symmetries, when the substrate for crystal growth is rotated once, with an axis passing through a center of a main surface of the substrate for crystal growth and orthogonal to the main surface as a central axis.

According to the present invention, it is possible to increase a diameter of a substrate for crystal growth, and manufacture a high-quality nitride crystal substrate using such a large diameter substrate for crystal growth.

BRIEF DESCRIPTION OF THE DRAWINGS

FIG. 3A is a planar view showing a modified example of the arrangement pattern of the seed crystal substrate 10, and FIG. 3B is a cross-sectional view taken along the line B-B' showing the group of the seed crystal substrates of FIG. 3A.

FIG. 8A is a cross-sectional configuration view showing a state of making the crystal film 14 grow thick on the seed crystal substrate 10, and FIG. 8B is a pattern diagram showing a state of obtaining a plurality of crystal growth substrates 30 or a plurality of crystal growth substrates 20 by slicing the thickly grown crystal film 14.

FIG. 11A is a view showing a state in which a cleavage work is performed with a depth of the recessed groove set to a depth of less than 60% of a thickness T of the material substrate 5, FIG. 11B is a view showing a state in which the cleavage work is performed with a depth of the recessed groove set to a depth of 60% of the thickness T of the material substrate 5, and FIG. 11C is a view showing a state in which the cleavage work is performed with a depth of the recessed groove set to a depth of 90% of the thickness T of the material substrate 5.

DETAILED DESCRIPTION OF THE INVENTION

An Embodiment of the Present Invention

An embodiment of the present invention will be described hereafter, with reference to the drawings.

(1) Manufacturing Method of a Nitride Crystal Substrate

In this embodiment, explanation is given for an example of manufacturing a crystal substrate made of a gallium nitride (GaN) crystal (referred to as a GaN substrate hereafter), as a nitride crystal substrate, by performing steps 1 to 5 shown below.

(Step 1: Preparation of Seed Crystal Substrates)

Figure 1A:
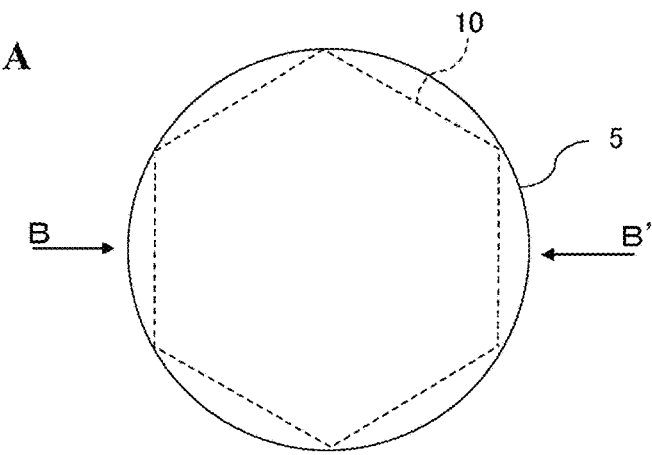
FIG. 1A is a planar view of a material substrate 5 used when producing a seed crystal substrate 10.
Figure 2A:
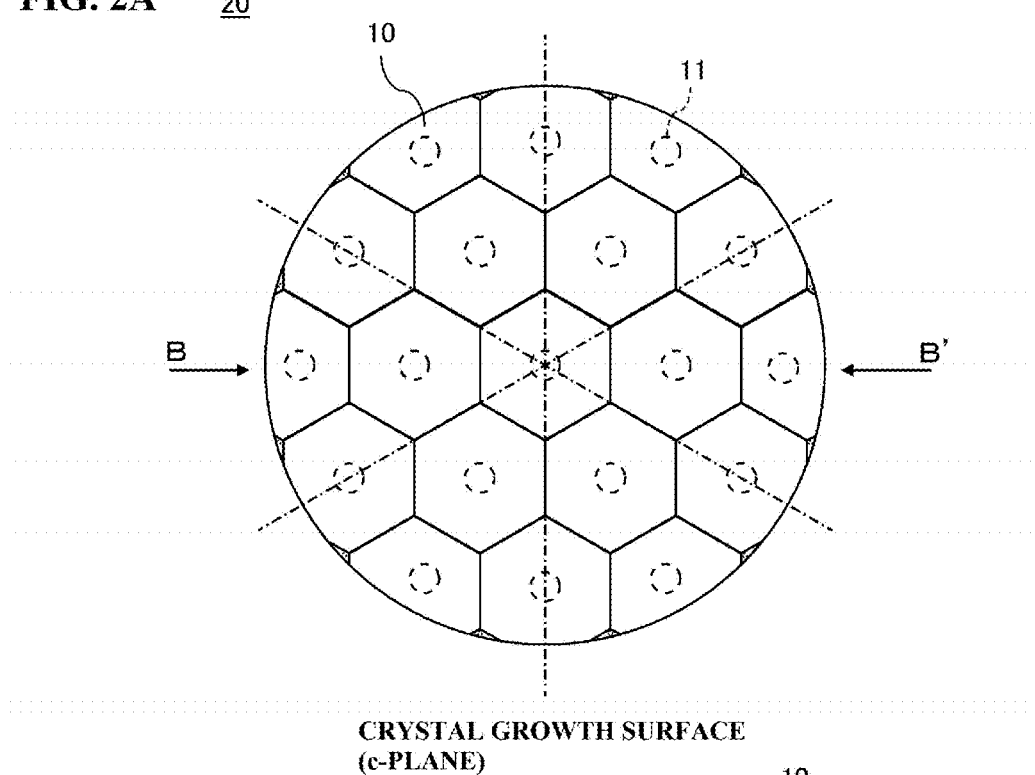
FIG. 2A is a planar view showing an example of an arrangement pattern of the seed crystal substrate 10.

In this embodiment, when the GaN substrate is manufactured, a crystal growth substrate 20 (hereinafter abbreviated as a substrate 20) having a disc-like outer shape as exemplified in planar view in FIG. 2A is used. In this step, first, a plurality of small diameter seed substrates (crystal substrates, material substrate) 5 (referred to as a substrate 5 hereafter) made of GaN crystals and whose outer shape is shown by a solid line in FIG. 1A, are prepared as a base material used at the time of preparing seed crystal substrates 10 (referred to as a substrate 10 hereafter) constituting the substrate 20. Each substrate 5 is a circular substrate having an outer diameter larger than each outer diameter of the substrates 10 to be prepared, and for example, can be prepared by epitaxially growing the GaN crystals on a ground substrate such as a sapphire substrate, etc., and cutting out grown crystals from the ground substrate and polishing the plane of the crystals. The GaN crystals can be grown using a publicly-known technique, irrespective of a vapor-phase growth method or a liquid-phase growth method. According to a current state of the art, in a case that a diameter of the substrate is about 2 inches, a high-quality substrate can be obtained at a relatively low cost, with a low defect density and a low impurity concentration, in which a variation of an off-angle, namely, a difference between a maximum value and a minimum value of the off-angle in its main surface (base surface for crystal growth), is for example 0.3° or less and relatively small. Here, the off-angle is defined as the angle between a normal line direction of the main surface of the substrate 5, and a main axis direction (the normal line direction of a low index plane closest to the main surface) of the GaN crystals constituting the substrate 5.

In this embodiment, as an example, explanation is given for a case of using a substrate with diameter of about 2 inches and thickness T of 0.2 to 1.0 mm as the substrate 5. Further in this embodiment, explanation is given for the following case: a substrate in which the main surface, namely, the crystal growth surface of the substrate 5 is parallel to c-plane of the GaN crystal, or having an inclination within ±5°, preferably within ±1° with respect to c-plane, is used as the substrate 5. Further, explanation is given for the following example in this embodiment: when preparing a plurality of substrates 5, a substrate group in which the variation of the off-angle (difference between the maximum value and the minimum value of the off-angle) in the main surface of the plurality of substrates 5 is 0.3° or less and preferably 0.15° or less, and the variation of the off-angle (difference between the maximum value and the minimum value of the off-angle) among the seed substrates 5 is 0.3° or less and preferably 0.15° or less, is used as the plurality of substrates 5.

The term of "c-plane" used in this specification can include not only the +c-plane of the GaN crystal, namely, a plane completely parallel to (0001) plane, but also a plane having a certain degree of inclination (vicinal) with respect to (0001) plane as described above. This point is also applied to a case of using the term of "a-plane" and "M-plane" in this specification. Namely, the term of "a-plane" used in this specification can include not only the a-plane of the GaN crystal, namely, a plane completely parallel to (11-20) plane, but also a plane having the similar inclination as the above inclination to this plane. Also, the term of "M-plane" used in this specification can include not only the M-plane of the GaN crystal, namely, a plane completely parallel to (10-10) plane, but also a plane having the similar inclination as the above inclination to this plane.

Figure 1B:
FIG. 1B is a cross-sectional view showing a state in which recessed grooves (scribe grooves) are formed on the back surface of the material substrate 5.
Figure 1C:
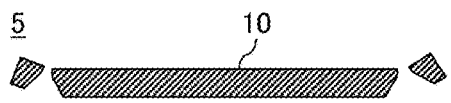
FIG. 1C is a pattern diagram showing a state of cleaving the material substrate 5 along the recessed grooves and removing the peripheral portions thereof.
Figure 1D:
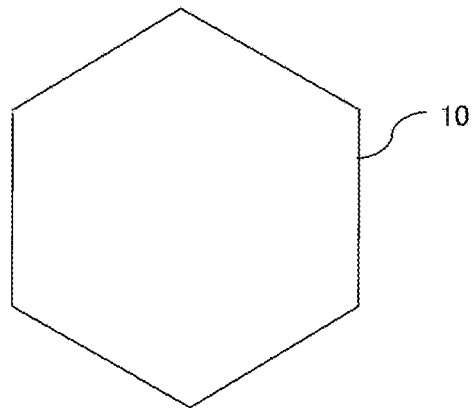
FIG. 1D is a planar view of the seed crystal substrate 10 obtained by removing the peripheral portion of the material substrate 5.

When the substrate 5 is prepared, as shown in FIG. 1B, recessed grooves, namely, scribe groves are formed on a back surface (-c-plane) which is an opposite side surface of a crystal growth surface (+c-plane). The recessed grooves can be formed using a publicly-known technique, for example such as a laser machining and mechanical machining. After the recessed grooves are formed, as shown in FIG. 1C, the substrate 5 is cleaved along the recessed groove and its peripheral portion is removed, whereby the substrate 10 is obtained. FIG. 1D shows a planar configuration of the substrate 10.

When the plurality of substrates 10 are arranged on the same surface, a planar shape of the substrates 10 is preferably a shape capable of forming a tessellation, that is, they can be laid over the entire in-plane area without gaps.

In this case, for the reason described later, it is preferable that all lateral surfaces of the substrates 10 in contact with adjacent lateral surfaces of other substrates 10, namely, all surfaces opposed to (facing) the lateral surfaces of other substrates 10 are planes other than M-plane, and are the planes in the same orientation each other (equivalent planes). For example, when the main surface (crystal growth surface) of the substrates 10 is c-plane like this embodiment, it is preferable that all lateral surfaces of the substrates 10 in contact with adjacent lateral surfaces of other substrates 10, are a-planes.

Since the GaN crystal has a hexagonal crystal structure, in order to satisfy the above requirement, at least the planar shape of each substrate 10 constituting at least a portion other than a peripheral portion (arc portion) of the substrate 20, is preferably an equilateral triangle, a parallelogram (internal angles 60° and 120°), a trapezoid (internal angles 60° and 120°), a regular hexagon, or a parallel hexagon, etc. If the planar shape of the substrate 10 is a square or a rectangle, the following case occurs: when any one of the lateral surfaces of the substrates 10 is a-plane, the lateral surface orthogonal to this plane inevitably becomes M-plane. If the planar shape of the substrate 10 is circular or elliptical, the tessellation is impossible, and the lateral surfaces of the substrates 10 cannot be the planes in the same orientation other than M-plane.

Of the several types of shapes described above, it is particularly preferable that the planar shape of the substrate 10 constituting at least a portion other than the peripheral portion of the substrate 20 is a regular hexagon as shown in FIG. 1D. In this case, it is possible to efficiently obtain, that is, perform material cutting of the substrate 10 with a maximum size, from the substrate 5 having a circular planar shape. Further, when the tessellation of the substrate 10 is made on the same surface in step 2 described later, a honeycomb pattern is constituted by an arrangement of a plurality of substrates 10, and the substrates 10 are arranged so as to engage with each other in a planar view. As a result, when an external force is applied to the plurality of arranged substrates 10 along the in-plane direction, it is possible to suppress the misalignment of the substrates 10 regardless of the direction. In contrast, when the planar shape of each substrate 10 is an equilateral triangle, a parallelogram, a trapezoid, a square, a rectangle, or the like, the substrates 10 are likely to be affected by an external force from a specific direction, as compared with a case in which the planar shape of the substrate 10 is a regular hexagon, thus easily allowing the misalignment of the substrates 10 to occur. In this embodiment, explanation is given for a case in which the planar shape of the substrate 10 is a regular hexagon. As shown in FIG. 2A, the planar shape of the substrate 10 constituting the peripheral portion of the substrate 20 is a shape such that a part of the regular hexagon is cut out in an arc shape along the outer periphery of the disc shaped substrate 20. For the substrate 10 constituting the peripheral portion of the substrate 20, that is, for the substrate 10 having a small area, one or more, preferably two or more together are preferably obtained from one substrate 5. When a plurality of substrates 10 are obtained from one substrate 5, this is preferable in a point that waste of the substrate 5 can be reduced, and a quality of the substrate 10 can be easily uniform.

Figure 1E:
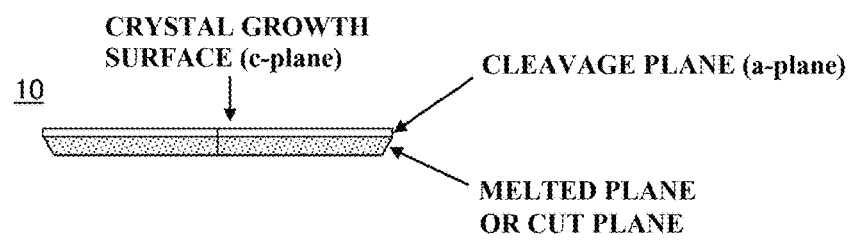
FIG. 1E is a lateral view of the seed crystal substrate 10.
Figure 12A:
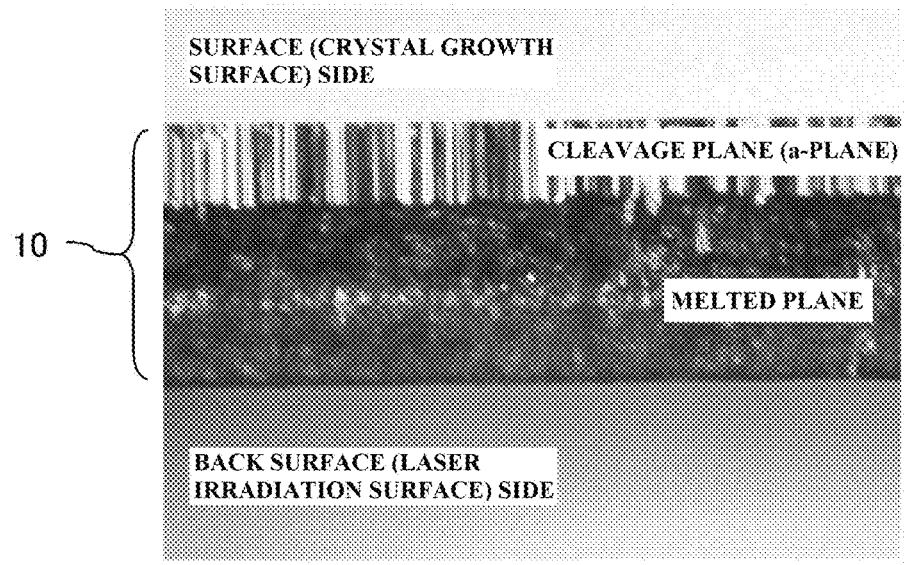
FIG. 12A is a view showing a state in which a-plane appears on a lateral surface by laser scribing and cleavage.

Regarding a plane orientations of the GaN crystal that can be taken, M-plane can be easily cleaved for the reason that a bond hand density per unit area is small (bond between atoms is weak), or the like. On the other hand, regarding the plane orientation (for example, a-plane) other than M-plane which is used in this embodiment, it is relatively difficult to be cleaved, for the reason that the bond hand density per unit area is larger (the bond between the atoms is stronger) than the bond hand density in the M-plane, or the like. In response to such a problem, in this embodiment, as described above, a cleavage work is performed after the recessed grooves (scribe grooves) are formed on the back surface of the substrate 5. This makes it possible to accurately cleave the substrate 5 in a cleavage weak plane (a plane hard to be cleaved) orientation other than M-plane. FIG. 1E shows a lateral surface configuration view of the substrate 10 obtained by the abovementioned technique. As shown in FIG. 1E, a melted plane (laser machined plane) or a cut plane (mechanically machined plane) generated by forming the recessed grooves on the back surface of the substrate 5, and a cleavage plane generated by cleaving the substrate 5 along the recessed grooves, are formed on the lateral surface of the substrate 10. The term of "melted plane" as used herein refers to a plane including an amorphous plane or the like formed by rapid solidification of a crystal after being melted once, for example. Further, the term of "the cut plane" as used herein refers to a plane having a relatively large surface roughness including a dehisced plane or the like, for example. FIG. 12A is an optical microscopic photograph of the lateral surface of the substrate 10 obtained by cleaving the substrate 5 along the a-plane with a depth of the recessed groove set to a depth of 65% of the thickness T of the substrate 5. According to FIG. 12A, it is found that the cleavage plane is arranged on the side closer to the crystal growth surface in the lateral surface of the substrate 10. By arranging the cleavage plane on the side closer to the crystal growth surface in this manner, it is possible to increase the combining strength between the adjacent substrates 10 and improve the quality of the crystal film formed around a combined part of the substrate 10, in step 3 described later.

It should be noted that the recessed grooves are provided to enhance the controllability when cleaving the substrate 5. Therefore, when forming the recessed grooves, it is necessary to adjust the depths of the recessed grooves so that the substrate 5 is not completely cut (fully cut).

When the cleavage work is performed along the plane orientation other than M-plane for example along the a-plane, the depth of the recessed groove is preferably set to a depth of 60% or more and 90% or less of the thickness T of the substrate 5. If the depth of the recessed groove is less than 60% of the thickness T of the substrate 5, it is difficult to obtain a desired cleavage plane in some cases like a case that the substrate 5 cracks along the highly cleavable M-plane. By setting the depth of the recessed groove to 60% or more of the thickness T of the substrate 5, the cleavage along the plane orientation other than M-plane for example along the a-plane can be successfully performed, and a desired cleavage plane can be obtained. Further, if the depth of the recessed groove is set to a depth exceeding 90% of the thickness T of the substrate 5, the combining strength between the substrates 10 becomes insufficient due to an excessively small area of the cleavage plane, and it is difficult to make the substrate 20 in a freestanding state in some cases. By setting the depth of the recessed groove to a depth of 90% or less of the thickness T of the substrate 5, the area of the cleavage plane can be sufficiently secured and the combining strength between the substrates 10 can be increased.

According to intensive studies by inventors of the present invention, it is found that the cleavage of the substrate 5 using the recessed groove can be performed not only in a linear portion but also in an arc portion. Therefore, when the substrate 10 constituting the peripheral portion (arc portion) of the substrate 20 is obtained out of the plurality of substrates 10, all lateral surfaces (linear and arc-shaped lateral surfaces) thereof are preferably formed by the cleavage work using the recessed grooves. In this case, it is possible to improve the quality of the crystal film grown on the substrate 20 over an entire in-plane area, that is, on the peripheral portion as well.

The left sides of FIGS. 11A to 11C show a state of the substrate 5 photographed from the front surface side after laser scribing the back surface of the substrate 5 and before the cleavage work, respectively. Also, the right sides of FIGS. 11A to 11C are respectively photographs showing a result of trying the cleavage applied to the substrate 5 after laser scribing. In FIG. 11A, the depth of the recessed groove is set to a depth of 55% of the thickness T of the substrate 5, and the cleavage along the a-plane is attempted. In FIG. 11B, the depth of the recessed groove is set to a depth of 60% of the thickness T of the substrate 5, and the cleavage along the a-plane is attempted. In FIG. 11C, the depth of the recessed groove is set to a depth of 90% of the thickness T of the substrate 5, and the substrate 10 constituting the peripheral portion of the substrate 20 is attempted to be obtained, that is, arc-shaped cleavage is attempted to be performed. As shown in FIG. 11A, when the depth of the recessed groove is set to a depth of less than 60%, the substrate 5 is broken along the highly cleavable M-plane, and cleavage cannot be successful along the a-plane. As shown in FIG. 11B, when the depth of the recessed groove is set to a depth of 60%, the cleavage of the substrate 5 along the weak cleavable a-plane is successful. As shown in FIG. 11C, when the depth of the recessed groove is set to a depth of 90%, the cleavage in an arc shape can be performed and the cleavage plane can be arranged on the crystal growth surface side of the lateral surface in the arc portion.

In order to accurately control a cleavage position, it is preferable that the sectional shape of the recessed groove is a V-like shape (a tapered shape with a wide opening) as shown in FIG. 1B. An opening width of the recessed groove is not particularly limited, but is exemplified by 0.2 to 1.8 mm, for example. By controlling the size and shape of the grooves in this way, a width of the cleavage plane (the width in a thickness direction) formed when the substrate 5 is cleaved, can be sufficiently secured while enhancing a controllability in cleaving the substrate 5. This makes it possible to increase the combining strength of the adjacent substrates 10 and improve the quality of the crystal film formed around the combining portion of the substrates 10 in step 3 described later.

When the abovementioned processing is performed, a large amount of cutting powder or dust of the substrate 5 is generated and attaches to the substrate 10, and in this state, a crystal growth described later may be adversely affected. Therefore, a cleaning process for removing cutting powder or dust is performed. For example, bubbling cleaning using a chemical solution obtained by mixing hydrogen chloride (HCl) and hydrogen peroxide water ($H_2O_2$) in a ratio of 1:1 can be given as a technique of performing cleaning.

(Step 2: Arrangement of the Seed Crystal Substrates)

When a plurality of substrates 10 are obtained, step 2 is performed. In this step, a plurality of substrates 10 made of GaN crystals are arranged in a planar appearance (tessellation) and in a disc shape, so that the main surfaces of the substrates 10 are parallel to each other and adjacent lateral surfaces are in contact with each other, that is, the lateral surfaces of the adjacent substrates 10 are in contact with each other (opposed to each other).

FIG. 2A is a planar view showing an example of an arrangement pattern of the substrates 10. In the case of using the substrate 10 having a regular hexagonal planar shape as in this embodiment, the honeycomb pattern is formed by filling the substrate 10 in a plane (tessellation). The plurality of substrates 10 constituting at least a portion other than a peripheral portion of the substrate 20 respectively has a main surface whose planar shape is a regular hexagon. As shown in FIG. 2A, when the substrate 20 is rotated once, with an axis passing through the center of the main surface of the substrate 20 and orthogonal to the main surface as a central axis, the honeycomb pattern obtained by matching the main surfaces of the substrates 10 is arranged so as to have two or more rotational symmetries, and six rotational symmetries in this arrangement example.

The description: "a plurality of substrates 10 are arranged so that their main surfaces are parallel to each other" includes not only a case in which the main surfaces of the adjacent substrates 10 are arranged completely in the same surface, but also a case in which there is a slight difference in the heights of these surfaces and a case in which these surfaces are arranged with a slight inclination with respect to each other. Namely, this description shows a case in which a plurality of substrates 10 are arranged so that the main surfaces of them are arranged in the same heights and in parallel to each other as much as possible. However, even in a case that there are difference in the heights of the main surfaces of the adjacent substrates 10, the size of each difference is preferably set to 20 μm or less for example at largest, and more preferably set to 10 μm or less. Further, even in a case that an inclination occurs in the main surfaces of the adjacent substrates 10, the size of the inclination is preferably set to 1° or less for example in the largest surface, and more preferably set to 0.5° or less. Further, when the plurality of substrates 10 are arranged, the variation of the off-angle in the main surface (difference between a maximum value and a minimum value of the off-angle in the entire main surface) of the substrate group obtained by arranging the plurality of substrates 10, is preferably set to 0.3° or less for example, and more preferably set to 0.15° or less. This is because if the variation of the off-angles, difference in the heights of the main surfaces of the adjacent substrates 10, and the inclination between the main surfaces of the substrates 10 are too large, there is sometimes a possibility of deteriorating the quality of the crystal grown in steps 3 and 5 (crystal growth step) described later. In the case where there is a difference in heights between the main surfaces of the substrates 10 or when there is an inclination between the main surfaces of the substrates 10, for example, a glass plate or the like, which has been previously confirmed as being flat, may be pressed against the main surface group of the plurality of substrates 10 arranged on the holding plate 12. This makes it possible to finely adjust the height and the inclination of the plurality of substrates 10 so that the main surfaces thereof are parallel to each other.

Further, the description: "a plurality of substrates 10 are arranged so that adjacent lateral surfaces are in contact with each other" includes not only a case in which the lateral surfaces of the adjacent substrates 10 are completely in contact with each other without gaps, but also a case in which there are slight gaps between them. Namely, this description shows a case in which the plurality of substrates 10 are opposed in proximity to each other so as not to allow the gap to occur between the lateral surfaces of the adjacent substrates 10. However, even when the gap occurs between the lateral surfaces of the adjacent substrates 10, the size of the gap in a room temperature condition is preferably set to 100 μm or less for example at largest, and more preferably set to 50 μm or less. This is because if the gap is too large, there is a case in which the adjacent substrates 10 are not combined, or even in a case that they are combined, the strength of combining them is insufficient, when step 3 (crystal growth step) describe later is performed. Further, in order to increase the combining strength between adjacent substrates 10 after step 3 is performed, it is preferable to arrange the adjacent substrates 10 such that at least cleavage planes of the lateral surfaces of the adjacent substrates 10 are in contact with each other.

Figure 2B:
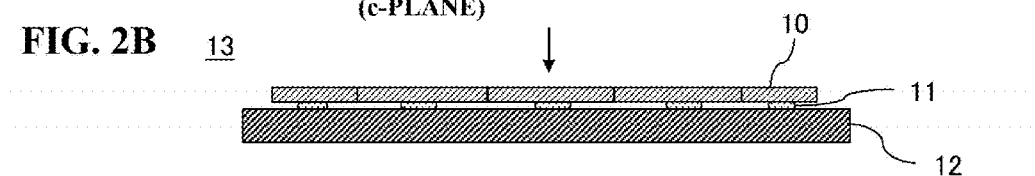
FIG. 2B is a cross-sectional view taken along the line B-B' showing the group of the seed crystal substrates of FIG. 2A.

In order to facilitate handling in step 3, a plurality of substrates 10 are preferably fixed, for example on the holding plate (support plate) 12 formed as a flat plate. FIG. 2B shows a cross-sectional configuration of an assembled substrate 13 formed by adhering a plurality of substrates 10 to the holding plate 12 formed in disc shape. As shown in this figure, the substrates 10 are placed on the holding plate 12 via a layer made of the adhesive agent 11 so that their main surfaces (c-plane which is a crystal growth surface) are faced upward. In other words, the layer made of the adhesive agent 11 is provided between the substrates 10 and the holding plate 12.

As the material of the holding plate 12, it is preferable to use the material having a heat-resistance and a corrosion resistance which can withstand a film-forming temperature and a film-forming atmosphere in step 3 (crystal growth step) described later, and having a linear expansion coefficient equal to or smaller than that of the crystal constituting the substrates 10 and the GaN crystal film 14 formed in step 3. By using such a material as the material of the holding plate 12, it is possible to suppress the formation of the gap between the substrates 10 in step 3 and the spreading of the gaps formed between the substrates 10. Here, the linear expansion coefficient means the coefficient of linear expansion in a direction parallel to the main surface (c-plane) of the substrate 10, that is, means the coefficient of linear expansion in a-axis direction of the GaN crystal constituting the substrate 10. The linear expansion coefficient of the GaN crystal in the a-axis direction is $5.59 \times 10^{-6}$/K. As materials exhibiting the linear expansion coefficient equal to or smaller than the above value, inexpensive, easy to obtain, and exhibiting a certain degree of rigidity, for example isotropic graphite, anisotropic graphite (pyrolytic graphite and the like), silicon (Si), quartz, silicon carbide (SiC), or the like, can be given. Above all, pyrolytic graphite (hereinafter also referred to as PG) from which the surface layer is likely to peel off, can be particularly preferably used, for the reason which will be described later. Further, it is also possible to suitably use a composite material obtained by coating the surface of a flat plate made of at least any one of isotropic graphite, Si, quartz, SiC or the like, with a material such as PG which is easily peelable and has an excellent corrosion resistance.

As a material of the adhesive agent 11, it is possible to suitably use a material which solidifies by being held for a predetermined time under a temperature condition far lower than a film-forming temperature in step 3, a material which solidifies by being dried for several minutes to several tens of hours under the temperature condition within a range from ordinary temperature to 300° C. for example. By using such a material as the material of the adhesive agent 11, it is possible to finely adjust a position, a height, an inclination or the like of the substrates 10 arranged on the holding plate 12 until the adhesive agent 11 is solidified. In addition, solidification of the adhesive agent 11 (fixture of the substrate 10) can be completed under a relatively low temperature condition before starting step 3, thus making it possible to start step 3 in a state of suppressing the misalignment of the substrates 10. As a result thereof, the quality of the GaN crystal film 14 to be grown in step 3 can be improved and the combining strength between the substrates 10 can be increased. In addition, an adhering work for adhering the substrates 10 can be performed for example manually, and the simplicity of the adhering work can be remarkably improved and the equipment required for the adhering work can be simplified.

Further, as the material of the adhesive agent 11, it is preferable to use a material having a heat-resistance and a corrosion resistance which can withstand the film-forming temperature and the film-forming atmosphere in step 3 (crystal growth step). By using such a material as the material of the adhesive agent 11, it is possible to prevent the adhesive agent 11 from thermally decomposing or the like, resulting in releasing the fixture of the substrates 10 during a temperature rise in step 3. In addition, by growing the GaN crystal film 14 while insufficiently fixing the substrates 10, it is possible to avoid occurrence of warping in the finally obtained substrate 20. It is also possible to avoid contamination of the growing atmosphere due to the thermal decomposition of the adhesive agent 11, thereby making it possible to prevent deterioration of the quality of the GaN crystal film 14 and decrease of the combining strength between the substrates 10.

As the material of the adhesive agent 11, it is preferable to use a material having a linear expansion coefficient close to that of the substrate 10 or the crystal constituting the GaN crystal film 14 formed in step 3. It is to be noted that "the linear expansion coefficient is close" means that the linear expansion coefficient of the adhesive agent 11 is substantially equal to the linear expansion coefficient of the crystal constituting the GaN crystal film 14, for example, a difference between the linear expansion coefficients of them is within 10%. By using such a material as the material of the adhesive agent 11, it is possible to alleviate a stress applied in the in-plane direction of the substrate 10 due to the difference in the linear expansion coefficients between the crystal constituting the GaN crystal film 14 and the adhesive agent 11, and it is possible to avoid occurrence of warping, cracks, or the like in the substrate 10.

As the material of the adhesive agent 11 satisfying these requirements, for example, a heat-resistant inorganic adhesive agent mainly containing a heat-resistant (fire-resistant) ceramic and an inorganic polymer can be used, and in particular, a material mainly containing zirconia, silica, etc. can be preferably used.

Examples of such adhesive agents include commercially available Aron Ceramic C agent and E agent (Aron Ceramic is a registered trademark of Toagosei Co., Ltd.). It is already confirmed that by drying and solidifying these adhesive agents at a temperature in a range of, for example, ordinary temperature to 300° C., it is already confirmed that a cured material is formed, having a heat-resistance to a high temperature of 1100 to 1200° C., having a high corrosion resistance which can withstand a film-forming atmosphere in step 3, and also having a high combining strength which does not cause the misalignment of the substrates 10 or the like to occur. Further, it is also confirmed that the above adhesive agent does not affect the crystal grown on the substrate 10. In addition, since the above adhesive agent has an appropriate viscosity of, for example, about 40000 to 80000 mPa·s at ordinary temperature in a stage before solidification, it is already confirmed that the above adhesive agent is significantly suitable when temporarily fastening or aligning the substrates 10 on the holding plate 12.

Figure 2C:
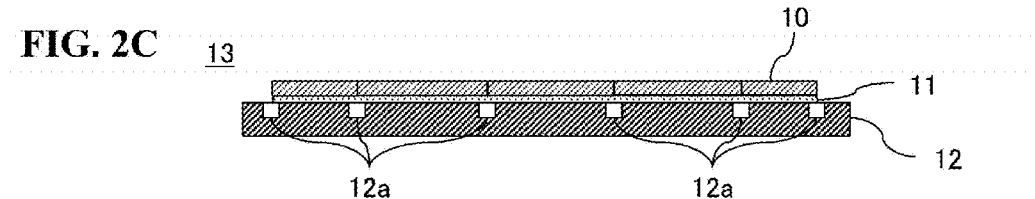
FIG. 2C is a cross-sectional view taken along the line B-B' showing a modified example in which recessed grooves 12a are provided on a surface side of a holding plate 12.

When the substrate 10 is adhered onto the holding plate 12, in order to prevent the adhesive agent 11 from leaking to the main surface side of the substrate 10 and so as not to protrude therefrom, it is preferable to apply the adhesive agent 11 to at least a region other than the peripheral portion of the substrates 10, for example, a region apart from the peripheral portion by a predetermined width, and preferably only in the vicinity of the center. When the adhesive agent 11 wraps around to the main surface side, the quality of the GaN crystal film 14 may be significantly deteriorated or the growth of the GaN crystal film 14 may be hindered in the wrapping portion and a surrounding portion thereof. The surface of the holding plate 12 may have a configuration to prevent the adhesive agent 11 from wrapping around. For example, as shown in FIG. 2C, by forming recessed grooves 12a on the surface of the holding plate 12 positioned below the peripheral portion of the adjacent substrates 10, and allowing the adhesive agent 11 which becomes excessive when adhering the substrates 10, to escape into the recessed grooves 12a, it is possible to suppress the leakage of the adhesive agent 11 to the main surface side of the substrate 10.

Figure 2D:
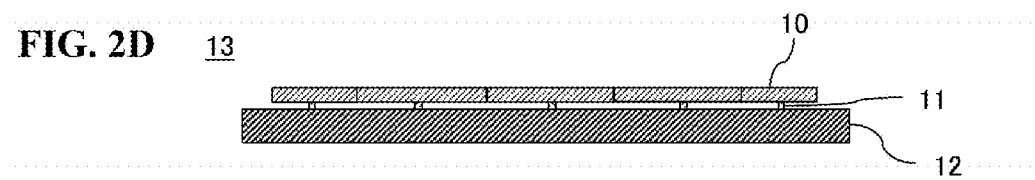
FIG. 2D is a cross-sectional view taken along the line B-B' showing a modified example in which an amount of an adhesive agent 11 is limited to an extremely small amount.

Incidentally, when there is a difference between the linear expansion coefficient of the holding plate 12 and the linear expansion coefficient of the substrate 10, particularly when the difference therebetween is large, as shown in FIG. 2D, it is preferable to limit the amount of the adhesive agent 11 applied to the back surface side of the substrates 10 to "extremely small amount". This is because by performing step 3, adjacent substrates 10 arranged on the holding plate 12 are combined with each other. After integrating (combining) the plurality of substrates 10 to obtain the substrate 20, the temperature of the substrate 20 and the holding plate 12 is decreased from a film-forming temperature to, for example, around ordinary temperature. When there is the above difference in the linear expansion coefficient, between the holding plate 12 and the substrate 10, a tensile stress or a compressive stress is applied in the in-plane direction of the substrate 20 due to a difference in thermal contraction amounts of these members. Depending on the difference in the linear expansion coefficient, a large stress is applied in the in-plane direction of the substrate 20, which may cause cracks or the like in the substrates 10 constituting the substrate 20 or the combined part. In response to such a problem, the inventor of the present invention has found that it is very effective to appropriately limit the amount of the adhesive agent 11. This is because by appropriately limiting the amount of the adhesive agent 11, when the abovementioned stress is applied in the in-plane direction of the substrate 20, the solidified adhesive agent 11 can be broken at an appropriate timing, or the fixed adhesive agent 11 can be peeled off from the substrate 10 or the holding plate 12, whereby fracture or the like of the substrate 10 can be avoided. Therefore, the term of "extremely small amount" used herein means an amount that can have a predetermined width, such as an amount capable of preventing the fixture of the substrate 10 onto the holding plate 12 and preventing the misalignment of the substrate 10 at least in proceeding step 3, and an amount capable of avoiding the fracture of the substrate 10 or the like, by breaking or peeling off the adhesive agent 11 which is in a solidified state, when the stress is applied to the substrate 20 at the time of a temperature decrease due to the difference in the abovementioned linear expansion coefficients.

Even when there is no difference in the linear expansion coefficient between the holding plate 12 and the substrate 10, or even when the difference therebetween is very small, it is preferable to set the amount of the adhesive agent 11 to the abovementioned "extremely small amount" when there is the difference in the linear expansion coefficients between the adhesive agent 11 and the substrate 10, and particularly when such a difference is large. This makes it possible to alleviate the stress applied in the in-plane direction of the substrate 10 due to the difference in the linear expansion coefficients between the adhesive agent 11 and the substrate 10, thereby making it possible to avoid the occurrence of warping, or cracks, etc. in the substrate 10.

When the amount of the adhesive agent 11 is limited to an extremely small amount, it is preferable to apply the adhesive agent 11 to a center portion of the substrate 10. It is easier to adjust a posture of the substrate 10 or to maintain the posture of the substrate 10 by applying the adhesive agent 11 to the center portion of the substrate 10 rather than to the region other than the center portion of the substrate 10. In addition, it is possible to reliably prevent the adhesive agent 11 from leaking to the main surface side. Further, when the temperature of each substrates 10 adhered onto the holding plate 12 is raised or decreased in step 3 or the like described later, the substrate 10 expands or contracts in a circumferential direction with a point adhered by the adhesive agent 11 as a base point. In this case, by adhering the adhesive agent 11 to the center portion of the substrate 10, it is possible to make the gaps between the adjacent substrates 10 uniform in the in-plane area of the substrate 20. Further, when there is no gap between the adjacent substrates 10, it is possible to make the distribution of the stress applied to the lateral surface (contact surface) of the adjacent substrates 10 uniform in the in-plane area of the substrate 20. However, the term of "central portion of the substrate 10" used herein is not necessarily limited to the geometric center of the substrate 10, and includes a region including the geometric center of the substrate 10 or a region in the vicinity thereof although the geometric center of the substrate 10 is not included.

By arranging the substrate 10 on the holding plate 12 via the adhesive agent 11 and solidifying the adhesive agent 11, preparation of the assembled substrate 13 is completed. In order to complete the solidification of the adhesive agent 11 in a state in which the main surfaces of the plurality of substrates 10 are parallel to each other and the lateral surfaces of the adjacent substrates 10 are in contact with each other, it is preferable to adjust positions, inclinations, and heights of the substrates 10 respectively, as needed. Incidentally, the solidification of the adhesive agent 11 is preferably completed before starting step 3. By doing so, an input of the assembled substrate 13 into HVPE apparatus 200 and a crystal growth described later can be performed respectively in a state in which the misalignment of the plurality of substrates 10 is suppressed.

(Step 3: Combination by Crystal Growth)

Figure 5:
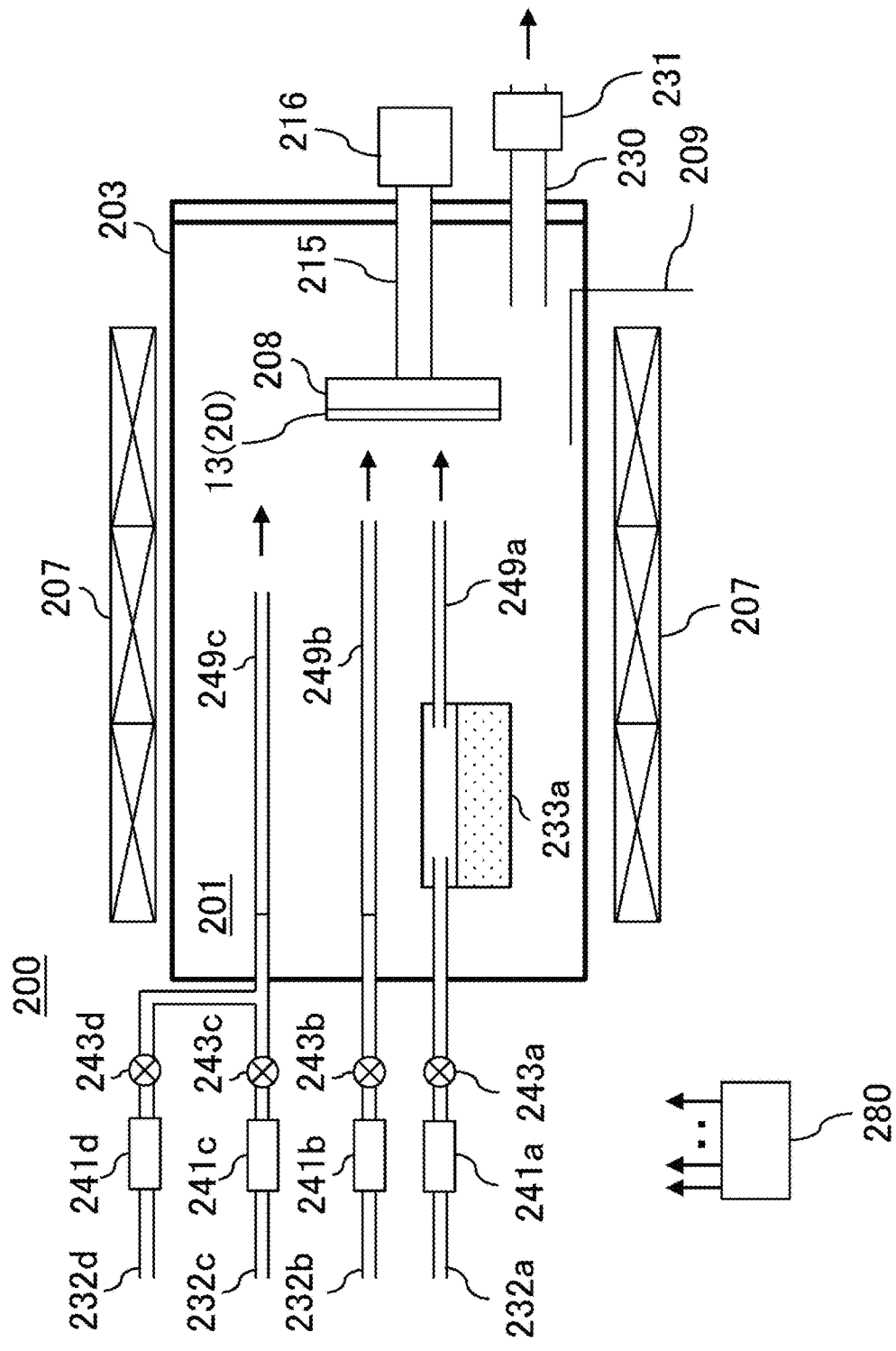
FIG. 5 is a schematic view of a vapor phase deposition apparatus used when growing a crystal film.

When the adhesive agent 11 is solidified and the preparation of the assembled substrate 13 is completed, GaN crystal film 14 which is a first crystal film (thin film for combination) is grown on the surface of the plurality of substrates 10 arranged in a planar appearance, using a HVPE apparatus 200 shown in FIG. 5.

The HVPE apparatus 200 is made of a heat-resistant material such as quartz, etc., and includes an airtight container 203 having a film-forming chamber 201 formed therein. A susceptor 208 for holding the assembled substrate 13 and the substrate 20, is provided in the film-forming chamber 201. The susceptor 208 is connected to a rotating shaft 215 provided in a rotation mechanism 216, and configured to be rotatable. Gas supply pipes 232a to 232c for supplying HCl gas, ammonia ($NH_3$) gas, and nitrogen ($N_2$) gas into the film-forming chamber 201, is connected to one end of the air tight container 203. A gas supply pipe 232d for supplying hydrogen ($H_2$) gas is connected to the gas supply pipe 232c. Flow rate controllers 241a to 241d, and valves 243a to 243d are respectively provided on the gas supply pipes 232a to 232d sequentially from an upstream side. A gas generator 233a for containing Ga melt as a raw material, is provided on a downstream side of the gas supply pipe 232a. A nozzle 249a for supplying gallium chloride (GaCl) gas which is a raw material gas (halide of raw materials) generated by a reaction between HCl gas and the Ga melt toward the assembled substrate 13, etc., held on the susceptor 208, is connected to the gas generator 233a. Nozzles 249b and 249c for supplying various gases supplied from these gas supply pipes toward the assembled substrate 13, etc., held on the susceptor 208, are respectively connected to the downstream side of the gas supply pipes 232b and 232c. An exhaust pipe 230 for exhausting inside of the film-forming chamber 201, is provided on the other end of the air tight container 203. A pump 231 is provided to the exhaust pipe 230. A zone heater 207 for heating the inside of the gas generator 233a and the assembled substrate 13, etc., held on the susceptor 208, to a desired temperature, is provided on an outer periphery of the air tight container 203, and a temperature sensor 209 for measuring a temperature inside of the film-forming chamber 201 is provided in the air tight container 203, respectively. Each member provided in the HVPE apparatus 200, is connected to a controller 280 configured as a computer, and is configured to control processing procedures and processing conditions described later, based on a program executed by the controller 280.

Figure 6A:
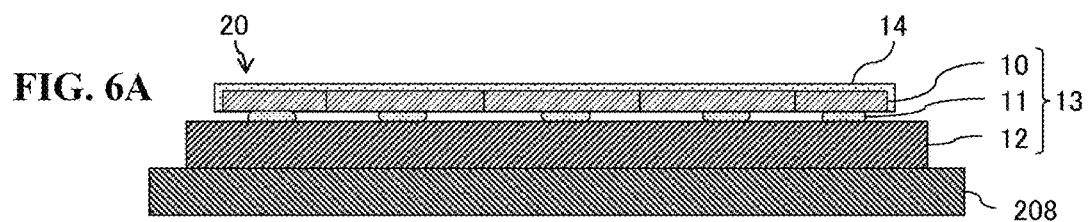
FIG. 6A is a pattern diagram showing a state in which a crystal film 14 is grown on the seed crystal substrate 10.

Step 3 can be performed using the abovementioned HVPE apparatus 200, for example by the following processing procedures. First, Ga polycrystal is put in the gas generator 233a as a raw material, and the assembled substrate 13 is loaded into the air tight container 203 and placed on the susceptor 208. Then, $H_2$ gas (or mixed gas of $H_2$ gas and $N_2$ gas) is supplied into the film-forming chamber 201, while executing heating and exhausting the inside of the film-forming chamber 201. Then, gas supply is performed from the gas supply pipes 232a and 232b in a state in which the inside of the film-forming chamber 201 is set in a desired film-forming temperature and in a desired film-forming pressure, and in a state in which the inside of the film-forming chamber 201 is set in a desired atmosphere, and GaCl gas and $NH_3$ gas, which are film-forming gases, are supplied to the main surface of the assembled substrate 13 (substrates 10). Thus, as shown in the cross-sectional view of FIG. 6A, GaN crystal is epitaxially grown on the surface of the substrates 10, and the GaN crystal film 14 is formed thereon. Owing to the formation of the GaN crystal film 14, the adjacent substrates 10 are combined with each other by the GaN crystal film 14, and formed into an integral state. As a result, the substrate 20 can be obtained. In order to prevent decomposition of the crystals constituting the substrates 10 in the film formation process, $NH_3$ gas is preferably supplied prior to the HCl gas, for example before heating the inside of the film-forming chamber 201. Further, in order to increase in-plane uniformity of the film thickness of the GaN crystal film 14 and increase the strength of combining the adjacent substrates 10 evenly in the in-plane area, step 3 is preferably performed in a state of rotating the susceptor 208.

Step 3 is performed based on the following processing conditions for example:

Film-forming temperature (temperature of the assembled substrate 13): 980 to 1100° C., and preferably 1050 to 1100° C.

Film-forming pressure (pressure in the film-forming chamber 201): 90 to 105 kPa, and preferably 90 to 95 kPa Partial pressure of GaCl gas: 1.5 to 15 kPa Partial pressure of $NH_3$ gas/partial pressure of GaCl gas: 2 to 6

Flow rate of $N_2$ gas/flow rate of $H_2$ gas: 1 to 20

A film thickness of the GaN crystal film 14 can be set to a thickness of 30 D μm or more when an outer diameter of the substrate 20 is set to D cm. When the film thickness of the GaN crystal film 14 is less than 30 D μm, the strength of combining the adjacent substrates 10 is insufficient, and the freestanding state of the substrate 20 cannot be maintained, and the step thereafter cannot be performed.

There is no particular upper limit in the film thickness of the GaN crystal film 14, but the crystal growth carried out here may be limited to the purpose of simply combining a plurality of substrates 10 to be in a freestanding state. In other words, the film thickness of the GaN crystal film 14 is preferably limited to a minimum necessary thickness for maintaining a combined state of the adjacent substrates 10, that is, for maintaining the freestanding state of the substrate 20, even when the substrate 20 composed of the mutually combined substrates 10 is removed from the holding plate 12 and subjected to cleaning, etc., in step 4 (peeling of the holding plate and cleaning) described later. As described in this embodiment, if step 5 is separately performed as a full-scale crystal growth step, waste of various gases used for film formation, or reduction of productivity of the GaN substrate in total, is caused in some cases when the film thickness of the GaN crystal film 14 to be formed in step 3, is set to too thick. From such a viewpoint, the film thickness of the GaN crystal film 14 may be set to a thickness of 100 D μm or less when an outer diameter of the substrate 20 is set to D cm.

From these facts, in this embodiment, when the outer diameter of the substrate 10 is 2 inches and the outer diameter of the substrate 20 is 6 to 8 inches, the thickness of the GaN crystal film 14 is, for example, in a range of 450 μm or more and 2 mm or less.

When the substrate 10 is combined by the GaN crystal film 14, all lateral surfaces of the substrates 10 in contact with lateral surfaces of the other substrates 10 are planes other than M-plane, and are planes mutually in the same orientation, thereby making it possible to increase the strength of combining them. When the film thicknesses of the GaN crystal films 14 are the same, the strength of combining the substrates 10 can be increased by combining the adjacent substrates 10 by a-planes rather than combining the adjacent substrates 10 by M-planes.

(Step 4: Peeling of the Holding Plate and Cleaning)

When the growth of the GaN crystal film 14 is completed and the adjacent substrates 10 are in a state of being combined with each other, supply of the HCl gas into the gas generator 233a and $H_2$ gas into the film-forming chamber 201, and heating by the heater 207, are respectively stopped in a state of supplying $NH_3$ gas and $N_2$ gas into the film-forming chamber 201 and exhausting the inside of the film-forming chamber 201. Then, after the temperature in the film-forming chamber 201 is 500° C. or less, supply of $NH_3$ gas is stopped, and thereafter an atmosphere in the film-forming chamber 201 is substituted with $N_2$ gas and is restored to the atmospheric pressure, and the temperature in the film-forming chamber 201 is decreased to a temperature for unloading the assembled substrate 13 therefrom. After such a temperature is decreased, the assembled substrate 13 is unloaded from the film-forming chamber 201.

Thereafter, the substrate 20 formed by combining the adjacent substrates 10 is peeled off from the holding plate 12, and they are separated from the holding plate 12 (the substrate 20 is set in a freestanding state).

Figure 6B:
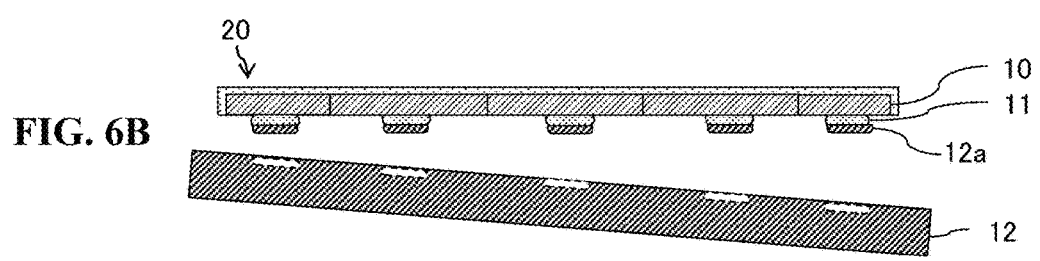
FIG. 6B is a pattern diagram showing a state of peeling a sacrificial layer 12a from a surface of the holding plate 12 and making a substrate 20 for crystal growth (abbreviated as substrate 20 hereafter) in a freestanding state.
Figure 6C:
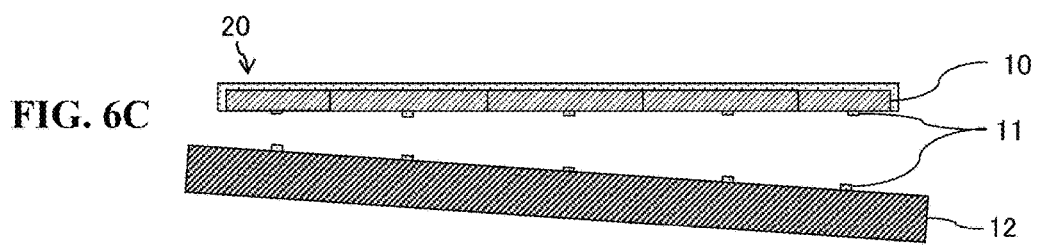
FIG. 6C is a pattern diagram showing a state of breaking or peeling a solidified adhesive agent 11 and making the crystal growth substrate 20 in a freestanding state.

When a material such as PG (a material from which a surface layer is more easily peeled off than the substrate 10) is used as the material of the holding plate 12, as shown in FIG. 6B, the surface layer of the holding plate 12 is thinly peeled off as a sacrificial layer (peel off layer) 12a, to thereby make it easy to make a freestanding state of the substrate 20 from the holding plate 12. The same effect can be obtained also when a composite material is used as the material of the holding plate 12, the composite material being obtained by coating the surface of a flat base material made of isotropic graphite, etc., with PG or the like. Although it is more expensive than PG, the same effect can be obtained even when pyrolytic boron nitride (PBN) is used as the material of the holding plate 12. In addition, even when a material such as isotropic graphite, Si, quartz, SiC or the like, is used, that is, even when a material that can not act as the sacrificial layer for the surface layer is used as the material of the holding plate 12, as shown in FIG. 6C, the solidified adhesive agent 11 is broken or peeled off at an appropriate timing by setting the amount of the adhesive agent 11 to an extremely small amount as described above, when the above stress is applied in the in-plane direction of the substrate 20. As a result, the substrate 20 can be easily in a freestanding state from the holding plate 12.

Figure 6D:
FIG. 6D is a pattern diagram of the crystal growth substrate 20 after back surface cleaning.

The adhesive agent 11 and the sacrificial layer 12a adhered onto the back surface of the freestanding substrate 20 (the back surface of the substrate 10) are removed using a cleaning agent such as an aqueous hydrogen fluoride (HF). As a result, the substrate 20 in the freestanding state as shown in FIG. 6D is obtained. The substrate 20 is used, with its main surface (the surface of the GaN crystal film 14) as a base surface for crystal growth, and the substrate 20 is sometimes distributed in the market as a large diameter substrate having a size of 100 mm or more and further exceeding 150 mm (6 inches). Until the polishing of the back surface of the substrate 20 is performed, trace of adhesion of residual components of the adhesive agent 11 or the sacrificial layer 12a may be left on the back surface of the substrate 10 even after the cleaning thereof.

(Step 5: Crystal Growth and Slicing)

Figure 7A:
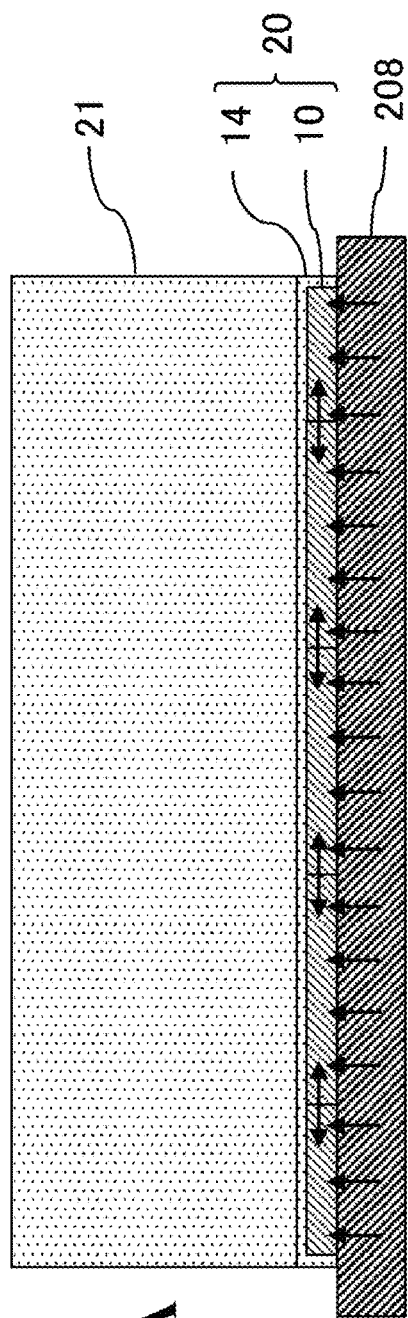
FIG. 7A is a pattern diagram showing a state of making a crystal film 21 grow thick on the crystal growth substrate 20.

In this step, GaN crystal film 21 which is a second crystal film (full growth film) is grown on the main surface of the freestanding substrate 20, using the HVPE apparatus 200 shown in FIG. 5, and by the same processing procedure as the processing procedure of step 3. FIG. 7A shows a state in which the GaN crystal film 21 is formed thick by the vapor phase growth method on the main surface of the substrate 20, that is, on the surface of the GaN crystal film 14.

The processing procedure of this step is almost the same as step 3, but as shown in FIG. 7A, this step is performed in a state that the substrate 20 configured to be freestandable state is placed directly on the susceptor 208. That is, this step is performed in a state in which the holding plate 12 and the adhesive agent 11 do not exist between the substrate 20 and the susceptor 208. Therefore, heat transfer between the susceptor 208 and the substrate 20 is efficiently performed, and it is possible to shorten the time required for raising and decreasing the temperature of the substrate 20. In addition, since the entire back surface of the substrate 20 is in contact with the susceptor 208, the substrate 20 is uniformly heated over the entire in-plane area thereof. As a result, it becomes possible to equalize the temperature condition in the main surface of the substrate 20, that is, in the crystal growth surface over the entire in-plane area thereof. In addition, since heat treatment is performed in a state in which the adjacent substrates 10 are integrally combined with each other, direct heat transfer (heat exchange) between the adjacent substrates 10, that is, heat conduction in the substrate 20 is promptly performed. As a result, it becomes possible to make the temperature condition on the crystal growth surface more uniform over the entire in-plane area. That is, in this step, since the crystal growth is carried out using the substrate 20 configured to be freestandable, the productivity of crystal growth can be improved and the in-plane uniformity or the like of crystals grown on the substrate 20 can be increased.

On the other hand, as exemplified in FIG. 13, an alternative method is conceivable as follows: a plurality of seed crystal substrates are arranged and adhered onto a holding plate with an adhesive agent interposed therebetween, crystals are then grown on these seed crystal substrates, respectively, and the crystal growth is continued, to thereby integrate multiple crystals. However, with this method, it may be difficult to obtain some effects out of the various effects described above. This is because in this method, heat transfer from the susceptor to the seed crystal substrates may be hindered by the holding plate and the adhesive agent interposed therebetween, which may reduce the heating efficiency of the substrate. Also, the efficiency of the heat transfer from the susceptor to the substrate is greatly affected by the application amount and application position or the like of the adhesive agent, and therefore in this alternative method, the heating efficiency between the substrates sometimes becomes uneven. Further, when a plurality of seed crystal substrates are arranged so that the adjacent seed crystal substrates are separated from each other (when the adjacent seed crystal substrates are not integrally combined), direct heat transfer (heat exchange) between these seed crystal substrates is difficult to occur, and as a result, the temperature condition on the crystal growth surface may be uneven between the seed crystal substrates in some cases. As a result thereof, according to this alternative method, the productivity of crystal growth is decreased or in-plane uniformity of the finally obtained crystal is decreased in some cases as compared with the method of this embodiment.

Figure 13:
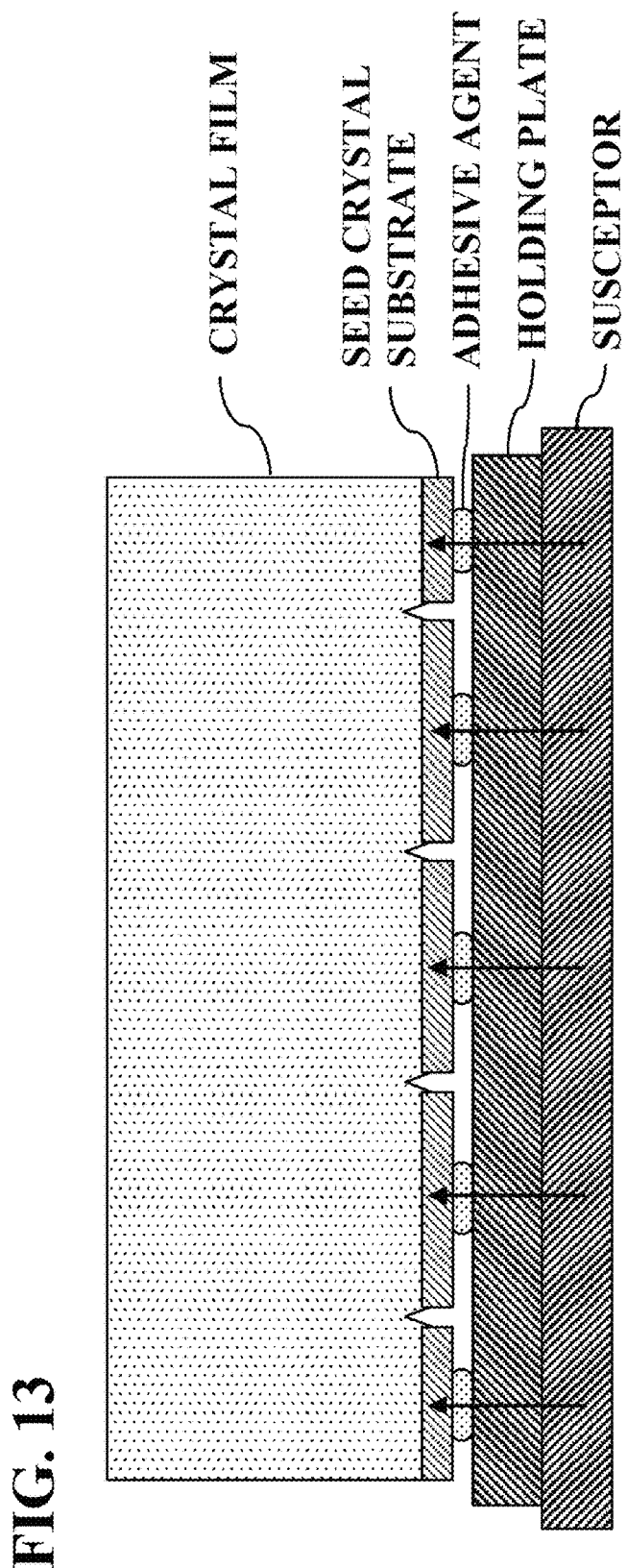
FIG. 13 is a pattern diagram showing a comparative example of a crystal growth method.

Therefore, it can be said that the crystal growth method of this embodiment using the substrate 20 configured to be freestanding, provides a great advantage in improving the productivity and the quality, as compared with the alternative method exemplified in FIG. 13.

It is to be noted that although the processing condition in step 5 can be the same as the processing condition in step 3 described above, it is preferable to make them different from each other. This is because the film-forming process in step 3 mainly performs for a combination between the adjacent substrates 10. Therefore, in step 3, it is preferable to grow the crystal under a condition that emphasizes a growth in a direction along the main surface (c-plane) (along a surface direction) rather than the growth toward the main surface direction (c-axis direction). On the other hand, the film-forming process in step 5 is mainly performed to grow the GaN crystal film 21 at a high speed and thickly on the substrate 20. Therefore, in step 5, it is preferable to grow the crystal under a condition that emphasizes a growth towards the main surface direction rather than a growth along the surface direction.

As a method for achieving the abovementioned object, there is for example a method of making an atmosphere in a film-forming chamber 201 different between step 3 and step 5. For example, the ratio of a partial pressure of $N_2$ gas to a partial pressure of $H_2$ gas ($N_2/H_2$) in the film-forming chamber 201 in step 5 is set to be smaller than the ratio of a partial pressure of $N_2$ gas to a partial pressure of $H_2$ gas ($N_2/H_2$) in the film-forming chamber 201 in step 3. As a result, in step 3, the crystal growth along the surface direction becomes relatively active, and in step 5, the crystal growth toward the main surface becomes relatively active.

As another method for achieving the abovementioned object, there is, for example, a method of making the film-forming temperature different between step 3 and step 5. For example, the film-forming temperature in step 5 is set to be lower than the film-forming temperature in step 3. As a result, in step 3, the crystal growth along the surface direction becomes relatively active, and in step 5, the crystal growth toward the main surface becomes relatively active.

As another method for achieving the abovementioned object, there is for example a method of making the ratio ($NH_3/GaCl$) of the supply flow rate of $NH_3$ gas to the supply flow rate of the GaCl gas different between step 3 and step 5. For example, the $NH_3/GaCl$ ratio in step 5 is set to be larger than the $NH_3/GaCl$ ratio in step 3. As a result, in step 3, the crystal growth along the surface direction becomes relatively active, and in step 5, the crystal growth toward the main surface becomes relatively active.

Step 5 is performed based on the following processing conditions for example:

Film-forming temperature (temperature of the substrate 20): 980 to 1100° C.

Film-forming pressure (pressure in the film-forming chamber 201): 90 to 105 kPa, and preferably 90 to 95 kPa Partial pressure of GaCl gas: 1.5 to 15 kPa Partial pressure of $NH_3$ gas/partial pressure of GaCl gas: 4 to 20

Flow rate of $N_2$ gas/flow rate of $H_2$ gas: 0 to 1

Figure 7B:
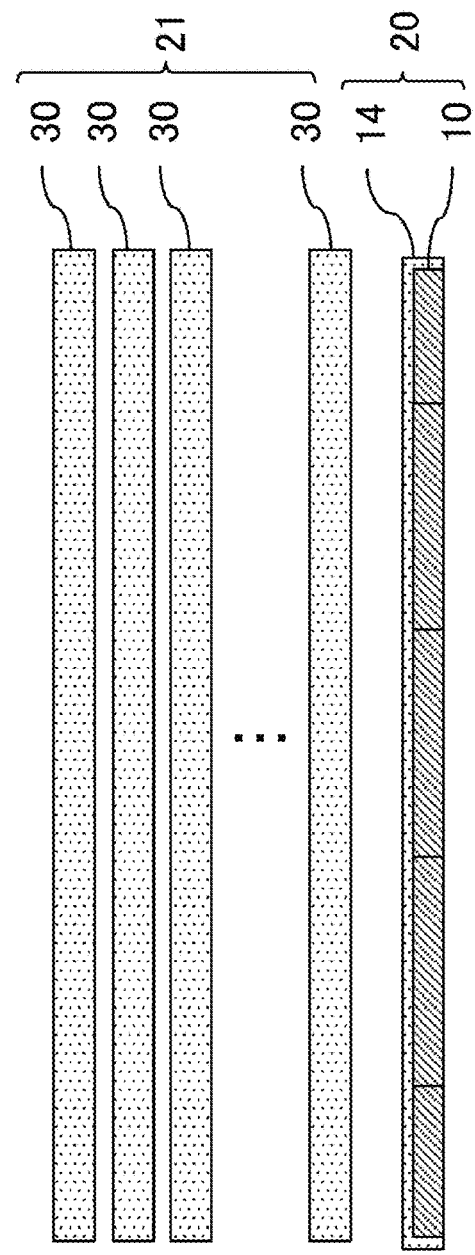
FIG. 7B is a pattern diagram showing a state of obtaining a plurality of nitride crystal substrates 30 by slicing the thickly grown crystal film 21.

After growth of the GaN crystal film 21 having a desired film thickness, the film-formation processing is stopped by the processing procedure similar to the processing procedure in the end of step 3, and the substrate 20 with the GaN crystal film 21 formed thereon, is unloaded from the film-forming chamber 201. Thereafter, by slicing the GaN crystal film 21 in parallel to its growth surface, as shown in FIG. 7B, one or more GaN substrates 30 having a disc-like outer shape can be obtained. The GaN substrate 30 is also a circular substrate having a large diameter of 100 mm or more, and further exceeding 150 mm (6 inches). Note that an entire laminated structure of the substrate 20 and the GaN crystal film 21 can also be regarded as a GaN substrate. In addition, when the substrate 20 is cutout from the GaN crystal film 21, it is also possible to re-perform step 5 using the cutout substrate 20, that is, to reuse the cutout substrate 20.

Figure 9:
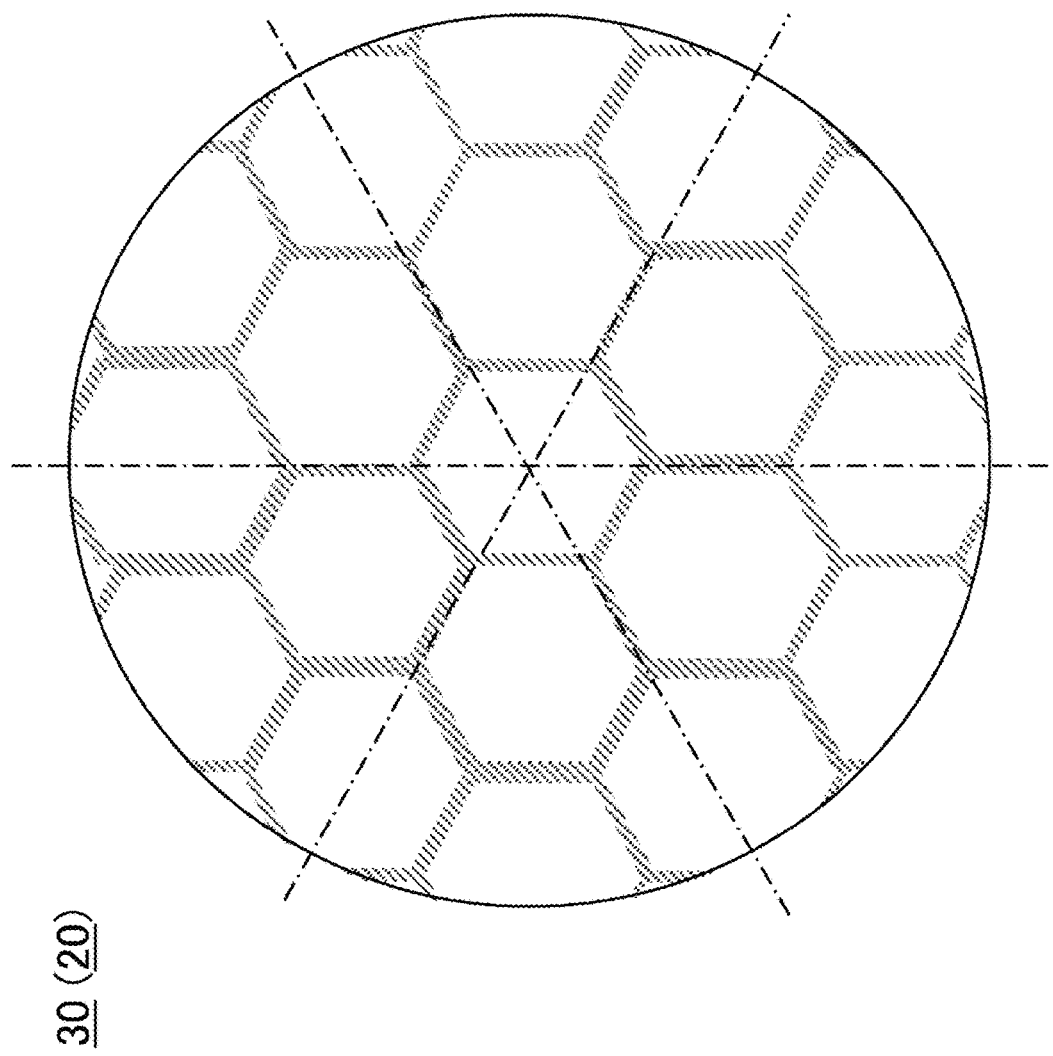
FIG. 9 is a pattern diagram exemplifying a planar configuration of the crystal growth substrate 20 and the nitride crystal substrate 30 produced by using the crystal growth substrate 20.

In addition, under an indirect influence of the combined part of the substrates 10, the GaN substrate 30 has a high defect region in which a defect density or an internal strain are relatively increased, that is, a region in which the strength or the quality are relatively decreased in some cases. The high defect region is a region having a defect density (internal strain) greater than an average defect density (or internal strain) in the GaN crystal film 21. The existence of this high defect region may be visible by the formation of grooves or steps on the surface or may not be visible. Even when the high defect region cannot be visible, it is possible to confirm the existence thereof by using a known analysis technique such as X-ray diffraction. When the main surface of the substrate 10 is a regular hexagon as shown in this embodiment, the high defect region provided in the GaN substrate 30 constitutes a honeycomb pattern in which regular hexagonal planar shapes are matched as shown by shading in FIG. 9. As shown in FIG. 9, it can be said that the high defect region is formed so as to be continuous on the main surface of the GaN substrate 30, thereby dividing a low defect region existing on the main surface of the GaN substrate 30. Also, it can be said that such a honeycomb pattern has twice or more, in this embodiment, six rotational symmetries when the substrate 20 is rotated once, with the axis passing through the center of the main surface of the GaN substrate 30 and orthogonal to the main surface as the central axis. Depending on the thickness of the GaN crystal film 21 and film-forming conditions, etc., the shape of the honeycomb pattern may be blurred (outline becomes ambiguous) and deformed in some cases. In particular, this tendency becomes stronger in the GaN substrate 30 obtained from the surface side of the GaN crystal film 21, when a plurality of GaN substrates 30 are obtained by slicing the GaN crystal film 21.

(2) Effect Obtained by this Embodiment

According to this embodiment, one or a plurality of effects shown below can be obtained.

Figure 10:
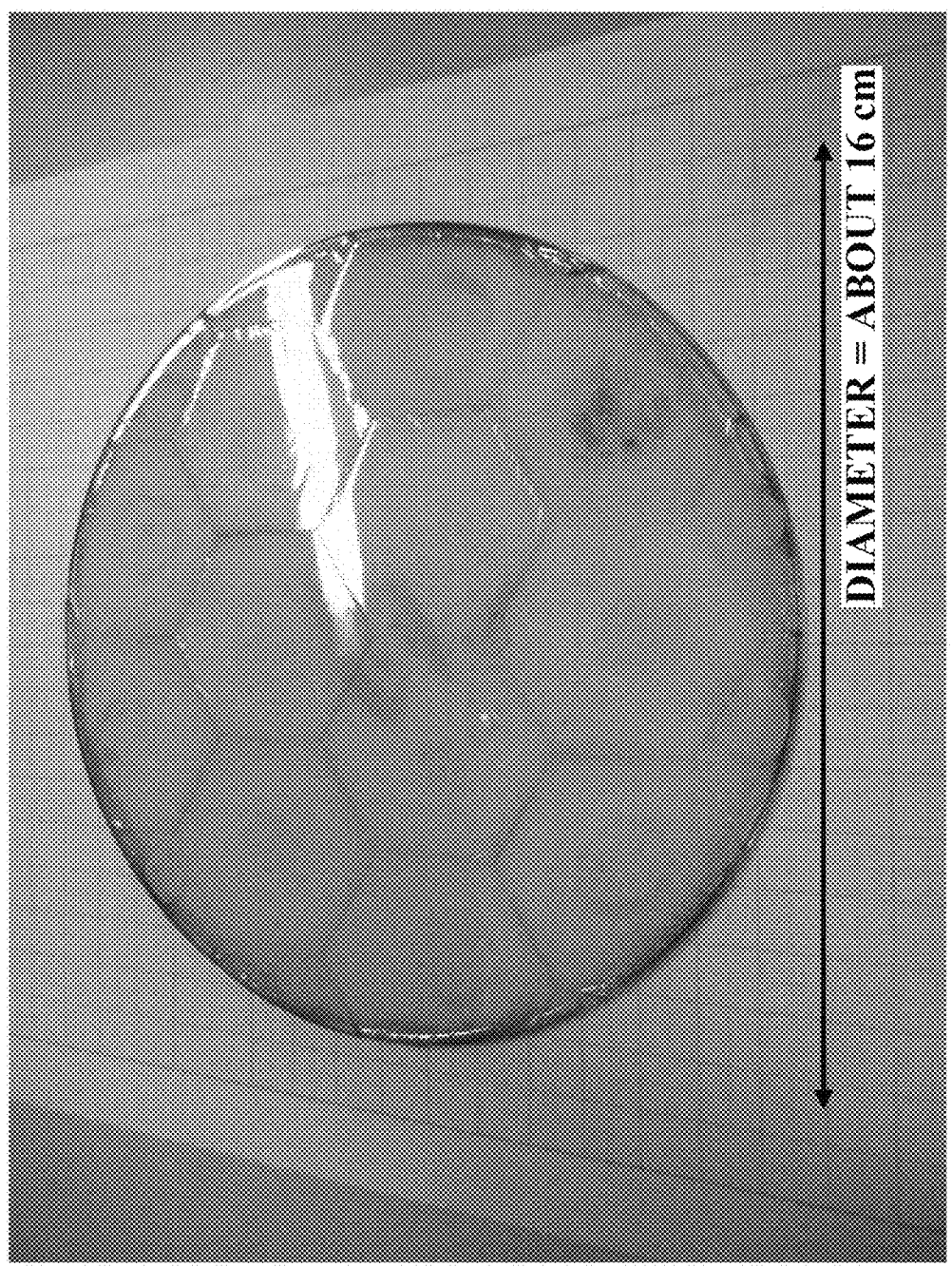
FIG. 10 is a photograph showing a configuration example of the crystal growth substrate 20 formed by combining a plurality of seed crystal substrates 10.

(a) By matching a plurality of relatively small diameter substrates 10, the outer diameter and the shape of the substrate 20 can be arbitrarily changed. In this case, even when the diameter of the substrate 20 is increased, increase of the variation of the off-angle in its main surface can be suppressed. For example, the variation of the off-angle in the main surface of the entire substrate 20 can be equal to or less than the variation of the off-angle in the main surface of each substrate 10. FIG. 10 is a photograph showing a configuration example of the substrate for crystal growth obtained by matching a plurality of regular hexagonal seed crystal substrates. The diameter of the substrate for crystal growth shown here is about 16 cm, and it is already confirmed that the variation of the off-angle in the main surface of the entire substrate for crystal growth is equal to or less than the variation of the off-angle in the main surface of each seed crystal substrate constituting the substrate for crystal growth. Thus, it can be said that the large diameter substrate for crystal growth with less variation of off-angle, is the substrate which is difficult to be manufactured without a knowledge as exemplified in this embodiment.

(b) By forming the planar shape of the substrate 10 as a regular hexagon, the honeycomb pattern obtained by matching the substrates 10 has two or more, in this embodiment, six rotational symmetries. Thereby, defects and strains included in the substrate 20, that is, defects and strains caused by being influenced by the combined part of the adjacent substrates 10 are uniformly distributed over the in-plane area (so as to have six rotational symmetries). As a result, the same effect can be obtained for the GaN substrate 30 prepared using the substrates 10, and such a substrate can be a high-quality substrate in which the warping distribution is uniform over the in-plane area and is not easily cracked.

(c) Since the honeycomb pattern obtained by matching the substrates 10 has six rotational symmetries, the adhesive agents 11 applied on the back surface of each substrate 10 are respectively arranged in substantially concentric circles with a central part of the substrate 20 as a center as shown in FIG. 2A. In addition, the fixing portions by the adhesive agents 11 are arranged so as to have six rotational symmetries with a central part of the substrate 20 as a center. As a result thereof, when the temperature of the substrate 20 and the holding plate 12 is decreased to, for example, near ordinary temperature in the end of step 3, a tensile stress or a compressive stress applied in the in-plane direction of the substrate 20 can be uniformly dispersed. As a result, it becomes easy to avoid damage on the substrate 10 constituting the substrate 20, and damage on the combined part.

(d) By forming the planar shape of the substrate 10 as a regular hexagon, the plurality of substrates 10 are arranged so as to be mutually engaged in planar view. This makes it possible to suppress the misalignment of the substrates 10 before the solidification of the adhesive agent 11 is completed in step 2 or in step 3 and in the subsequent steps. As a result, it is possible to increase a combining strength between the substrates 10 and improve the quality of the GaN crystal films 14 and 21 grown thereon.

Figure 14A:
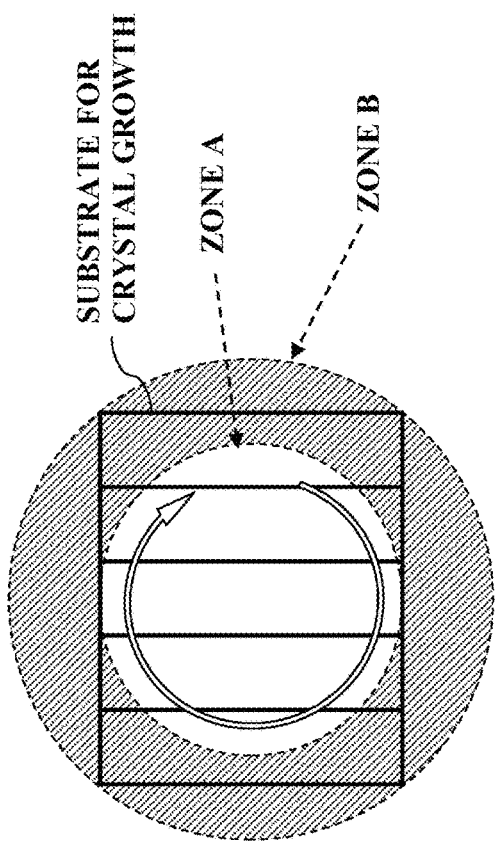
FIG. 14A and FIG. 14B are pattern diagrams showing a comparative example of a crystal growth substrate respectively.
Figure 14B:
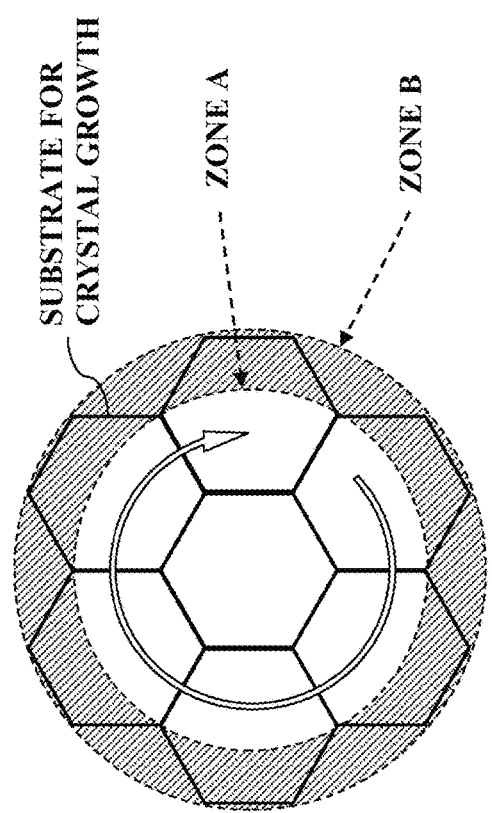

(e) By forming all lateral surfaces of the substrates 10 in contact with lateral surfaces of other substrates 10, as the planes other than M-plane and as the planes having the same orientation each other, it is possible to increase the combining strength when the adjacent substrates 10 are combined in step 3 (crystal growth step). For example, by combining the substrates 10 with each other by the a-planes, it is possible to increase the combining strength between the substrates 10, compared with the case in which they are combined with each other by the M-planes.
(f) When the substrate 10 is obtained from the substrate 5, it is possible to cleave the substrate 5 with good controllability by previously forming the recessed grooves on the back surface of the substrate 5. This makes it possible to cleave the lateral surface of the substrate 10 by a plane other than the M-plane (a plane hard to be cleaved). Further, by forming the recessed grooves on the back surface side of the substrate 5, the cleavage plane can be arranged on the crystal growth surface side of the lateral surface of the substrate 10. This makes it possible to improve the quality of the GaN crystal film 14 formed between the substrates 10, and increase the combining strength between the substrates 10. Further, by performing a cleavage process using the recessed grooves not only at the combined part (linear portion) of the substrate 10 but also at the peripheral portion (arc portion) of the substrate 20, the crystal quality at the peripheral portion of the GaN crystal film 14 is improved. Likewise, regarding the GaN substrate 30 obtained by slicing the GaN crystal film 21, it is possible to improve the crystal quality at the peripheral portion (arc portion).
(g) Since the material that solidifies by being held for a predetermined time under a temperature condition much lower than the film-forming temperature in step 3 is used as the adhesive agent 11, the position of the substrate 10, etc., can be finely adjusted, and the adhering work can be performed easily. In addition, since a material that can withstand the film-forming temperature in step 3 etc., is used as the adhesive agent 11, it is possible to avoid release of the fixture of the substrate 10, warping of the substrate 20, etc., and contamination of the growth atmosphere in step 3.
(h) The crystal growth is carried out in a state in which a plurality of substrates 10 are adhered on the holding plate 12 (a state in which the adhesive agent 11 is solidified). Therefore, it is possible to suppress the misalignment of the substrates 10 in this process, increase the combining strength between the substrates 10, and improve the quality of crystals grown thereon. In addition, compared with a case where the substrate 10 is fixed on the holding plate 12 by fixing the substrate 10 from the outer periphery with a jig without using the adhesive agent 11, it is possible to increase the combining strength between the substrates 10 and improve the quality of the crystal to be grown thereon. This is because when the jig is used, a pressure is applied to the arranged substrates 10 along its arrangement direction at least at a room temperature. Then, at the film-forming temperature, the pressure increases due to the influence of thermal expansion, the arrangement of the substrate 10 collapses, the main surface can not exist on the same plane, chipping and cracks occur in the substrate 10, and further, particles generated at that time sometimes get on the main surface. By adhering the substrates 10 using the adhesive agent 11, it is possible to avoid these problems.
(i) Since the crystal growth is carried out in a state in which a plurality of substrates 10 are adhered onto the holding plate 12 (a state in which the adhesive agent 11 is solidified), crystals growing on each substrate 10 interact to generate stress applied to the substrates 10. Even in such a case, the misalignment of the substrates 10 or the like can be avoided. As the crystal growth proceeds, interaction acts so that the growth surface of the crystal growing on each substrate 10 becomes a continuous surface, that is, so as to make the substrate 10 inclined or raised. However, by carrying out the crystal growth in a state in which the adhesive agent 11 is solidified as described in this embodiment, it is possible to avoid the inclination and rise of the substrates 10 in the process. As a result, it is possible to suppress the warping of the finally obtained substrate 20, and avoid an increase in variation of the off-angle on the entire main surface of the substrate 20.
(j) By using the material such as PG or the like whose surface acts as the sacrificial layer 12a as the material of the holding plate 12, the substrate 20 can be easily freestanding from the holding plate 12. In addition, even when using a material such as Si, quartz, and SiC that is difficult to make its surface act as the sacrificial layer as the material of the holding plate 12, the substrate 20 can be easily freestanding by setting the amount of the adhesive agent 11 to an extremely small amount.
(k) By forming the substrate 20 into a disc shape, it is possible to increase the in-plane uniformity of the crystal grown on the substrate 20. This is because when the vapor phase growth is carried out by rotating the substrate 20 in the HVPE apparatus 200 as described in this embodiment, it is possible to make conditions uniform for supplying a raw material gas, etc., in the in-plane area of the substrate 20 by forming the substrate 20 into a disc shape. On the other hand, in the case of using a rectangular substrate for crystal growth obtained by combining reed-shaped seed crystal substrates as shown in FIG. 14A, or in a case of using a honeycomb-shaped substrate for crystal growth obtained by combining hexagonal seed crystal substrates having the same size and the same shape, difference is more likely to occur in various conditions such as supply amounts and consumption amounts of the raw material gas, and temperature or the like, between the inner peripheral side (zone A) and the outer peripheral side (zone B). Therefore, in these cases, it is difficult to increase the in-plane uniformity of the crystal as described in this embodiment.

Other Embodiment

As described above, embodiments of the present invention have been described specifically. However, the present invention is not limited to the abovementioned embodiments, and can be variously modified in a range not departing from the gist of the invention.
(a) In the abovementioned embodiment, when the substrate 20 is rotated once, with an axis passing through the center of the main surface of the substrate 20 and orthogonal to the main surface as a central axis, the honeycomb pattern obtained by matching the substrates 10 has six rotational symmetries. However, the present invention is not limited thereto.

For example, as shown in FIG. 3A, even when the honeycomb pattern obtained by matching the substrates 10 has three rotational symmetries, substantially the same effect as the abovementioned embodiment can be obtained. However, the arrangement shown in FIG. 2A is more preferable than the arrangement shown in FIG. 3A in the point that defects and strains included in the substrate 20 can be uniformly dispersed over the entire in-plane area. As a result, the same effect can be obtained regarding the finally obtained GaN substrate 30, and this arrangement is also preferable in the point that a warping distribution is more uniform over the in-plane area, thus making it possible to make this substrate a high-quality substrate which is hardly cracked. Further, this arrangement is also preferable in the point that in the end of step 3, the stress applied in the in-plane direction of the substrate 20 can be more uniformly dispersed as the temperature decreases, and damage of the substrate 20 can be easily avoided.

Figure 4A:
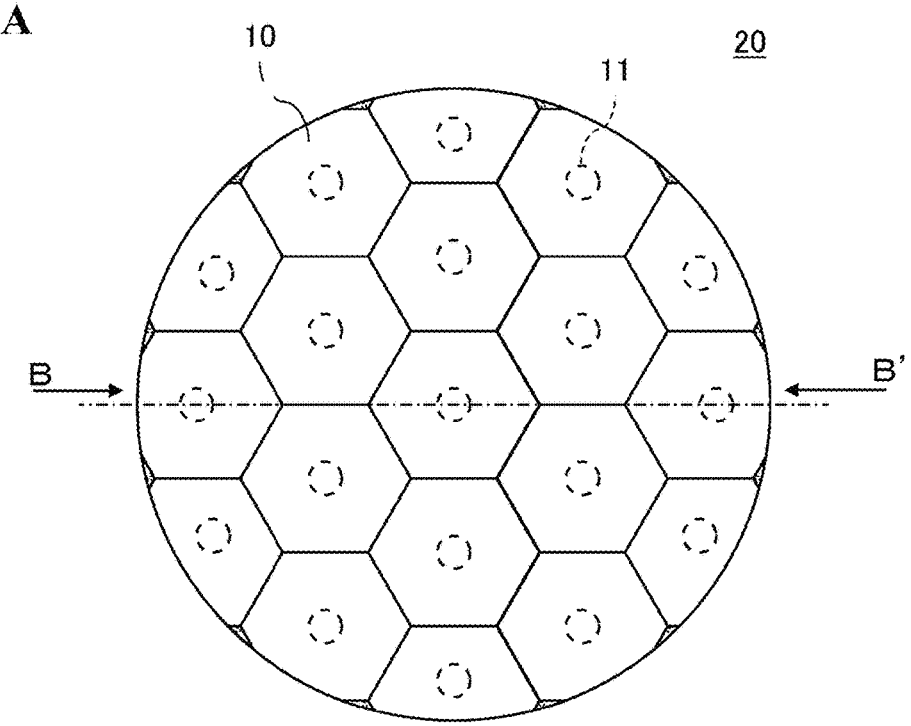
FIG. 4A is a planar view showing a modified example of the arrangement pattern of the seed crystal substrate 10.
Figure 4B:
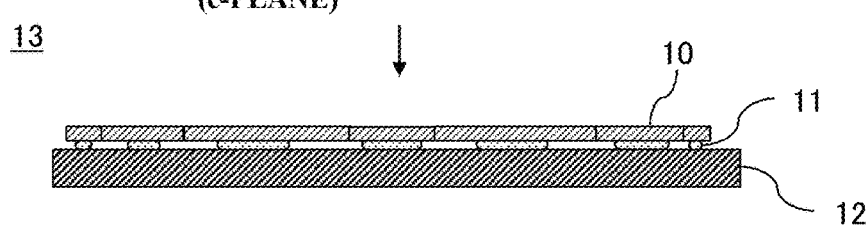
FIG. 4B is a cross-sectional view taken along the line B-B' showing the group of the seed crystal substrates of FIG. 4A.

Further, for example, as shown in FIG. 4A, even when the honeycomb pattern obtained by matching the substrates 10 has two rotational symmetries (that is, line symmetries), substantially the same effect as the abovementioned embodiment can be obtained. However, the arrangement shown in FIG. 2A and FIG. 3A is more preferable than the arrangement shown in FIG. 4A in the point that the defects and strains included in the substrate 20 can be more uniformly dispersed over the in-plane area. As a result, the same effect can be obtained regarding the finally obtained GaN substrate 30, and this arrangement is also preferable in the point that a warping distribution is more uniform over the in-plane area, thus making it possible to make this substrate a high-quality substrate which is hardly cracked. Further, this arrangement is also preferable in the point that in the end of step 3, the stress applied in the in-plane direction of the substrate 20 can be more uniformly dispersed as the temperature decreases, and damage of the substrate 20 can be easily avoided.

(b) In the abovementioned embodiment, explanation is given for a case in which all lateral surfaces of the substrates 10 in contact with the lateral surfaces of other substrates 10 are a-planes. However, the present invention is not limited thereto, and the substrates 10 may be combined by the planes other than a-planes.

Figure 12B:
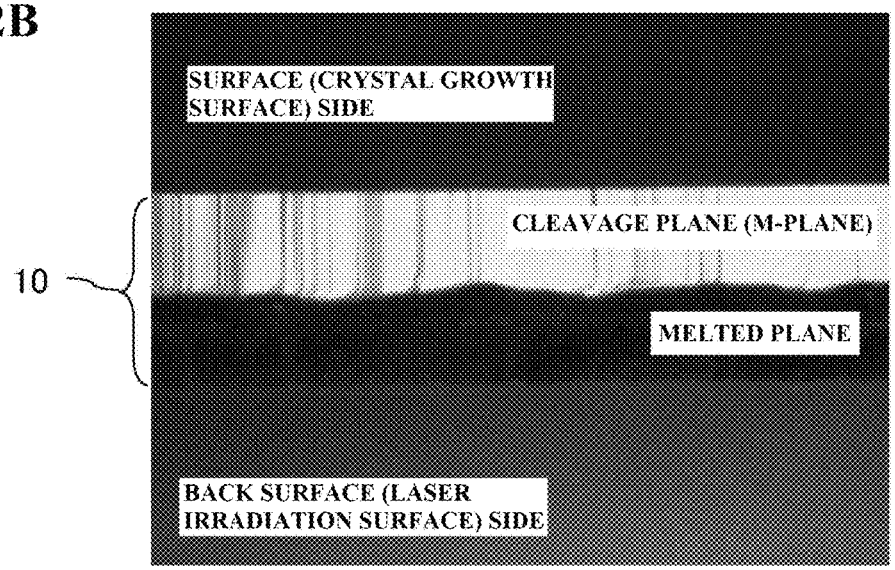
FIG. 12B is a view showing a state in which M-plane appears on the lateral surface by laser scribing and cleavage.

(c) All lateral surfaces of the substrates 10 in contact with lateral surfaces of the other substrates 10 may be M-planes. Since the M-plane is the plane which is easy to cleave, the substrate 10 can be efficiently manufactured from the substrate 5 at a low cost. In this case, the depth of the recessed groove (scribe groove) formed on the back surface side of the substrate 5 is preferably set to a depth within a range of, for example, 20% or more and 60% or less of the thickness T of the substrate. FIG. 12B shows an optical micrograph of the lateral surface of the substrate 10 obtained by cleaving the substrate 5 along the M-plane, with a depth of the recessed groove set to a depth of 50% of the thickness T of the substrate 5. By setting the depth of the recessed groove to be shallower than that in the case of cleaving by the a-plane, the time required for forming the scribe grooves can be shortened and the productivity at the time of manufacturing the substrate 20 can be improved. In addition, it is possible to secure a large area of the cleavage plane appearing on the lateral surface of the substrate 10, and as a result, it is possible to compensate for the combining strength between the adjacent substrates 10 which is likely to be insufficient in the case of the combining by M-planes.

Further, in this case, when a plurality of substrates 5 are prepared, it is preferable that variations of the off-angles (difference between a maximum value and a minimum value of the off-angles) in the main surface of each substrate 5 are less than 0.1°, and variations of the off-angles (difference between a maximum value and a minimum value of the off-angles) among a plurality of substrates 5 are less than 0.1°. This makes it possible to sufficiently increase the combining strength between the adjacent substrates 10.

Further in this case, it is also possible to increase the combining strength between the adjacent substrates 10 by making the thicknesses of the adjacent substrates 10 different from each other and providing a difference in the heights of these main surfaces. This is because by providing the difference in the heights of the main surfaces, it is possible to disturb a gas flow in the vicinity of the combined part of the adjacent substrates 10 (causing the gas to stay in the vicinity of the combined part), thereby making it possible to promote the crystal growth locally in the vicinity of the combined part. Further, by providing the difference in the heights of the main surfaces, it is possible to appropriately control the direction of the gas flow flowing in the vicinity of the combined part or the like, thereby making it possible to promote crystal growth along the surface direction.

(d) In the abovementioned embodiment, explanation is given for a case in which the holding plate 12 and the substrates 10 are made of different materials, and they are adhered to each other by using the adhesive agent 11. However, the present invention is not limited thereto. For example, a substrate made of GaN polycrystal (GaN polycrystalline substrate) may be used as the holding plate 12, and the holding plate 12 and the substrates 10 may be directly combined without interposing the adhesive agent 11 therebetween. For example, by plasma-treating the surface of the holding plate 12 made of GaN polycrystal, the main surface thereof is terminated with OH groups, and thereafter, the substrate 10 is directly placed on the main surface of the holding plate 12, thus integrally combining them. Then, moisture or the like remaining between the holding plate 12 and the substrate 10 can be removed by annealing the laminated body formed by combining the holding plate 12 and the substrate 10, and the laminated body can be suitably used as the abovementioned assembled substrate 13 or the substrate 20. However, when such a combining technique is used, it is difficult to finely adjust the positions, heights, inclinations, or the like of the substrates 10 arranged on the holding plate 12. In addition, it is difficult to perform the adhering work for adhering the substrates 10 manually or with simple equipment. In addition, it is also difficult to remove the holding plate 12 from the substrate 20 after crystal growth. Therefore, as described in the abovementioned embodiment, it is preferable to adhere the substrate 10 onto the holding plate 12 using the adhesive agent 11.

(e) In the abovementioned embodiment, explanation is given for a case in which the hydride vapor phase epitaxy method (HVPE method) is used as the crystal growth method in steps 3 and 5, but the present invention is not limited thereto. For example, in any one or both of steps 3 and 5, a crystal growth method other than HVPE method, such as metal organic chemical vapor deposition method (MOCVD method) may be used. Even in this case, the same effect as the effect of the abovementioned embodiment can be obtained.

(f) In the abovementioned embodiment, explanation is given for a case in which the GaN substrate 30 is manufactured by preparing the freestanding substrate 20 by peeling it from the holding plate 12 and growing the GaN crystal film 21 thereon. However, the present invention is not limited thereto. That is, after the assembled substrate 13 is prepared, the GaN crystal film 14 is thickly grown on the substrate 10 as shown in FIG. 8A, and then the GaN crystal film 14 is sliced as shown in FIG. 8B so that one or more GaN substrates 30 may be obtained. In other words, from the preparation of the assembled substrate 13 to the manufacture of the GaN substrate 30 may be performed consistently without going through the step of making the substrate 20 in a freestanding state. In this case, unlike the abovementioned embodiment, heating of the substrate 10 is performed via the holding plate 12 and the adhesive agent 11, so the heating efficiency may be reduced in some cases. However, in other respects, substantially the same effect as the abovementioned embodiment can be obtained. When the GaN crystal film 14 is sliced, the adhesive agent 11 or the like adhering to the back surface side of the substrate 10 may be removed beforehand.

(g) In the abovementioned embodiment, explanation is given for a case in which the adjacent substrates 10 are combined with each other and used as the substrate 20, that is, the case in which the substrate 20 includes the substrates 10. However, the present invention is not limited thereto. That is, each of one or more substrates obtained by slicing the GaN crystal film 14 grown thick as described above may be used as the substrate 20. Even in this case, the same effect as the effect of the abovementioned embodiment can be obtained.

The substrate 20 thus obtained does not include the substrates 10 in its configuration unlike the abovementioned embodiment, but similarly to the GaN substrate 30, the substrate 20 has a high defect region in which a defect density and an internal strain are relatively increased in some cases under an indirect influence of the combined part of the substrates 10. When the main surface of the substrate 10 is a regular hexagon, as shown by shading in FIG. 9, the high defect region constitutes the honeycomb pattern which has six rotational symmetries. This point is as described above.

(h) The present invention is not limited to GaN, and can be suitably applied when manufacturing a substrate made of a nitride crystal such as aluminum nitride (AlN), aluminum gallium nitride (AlGaN), indium nitride (InN), indium gallium nitride (InGaN), aluminum indium and gallium nitride (AlInGaN), that is, group III nitride crystal represented by a composition formula of $Al_xIn_yGa_{1-x-y}N$ ($0 \leq x \leq 1$, $0 \leq y \leq 1$, $0 \leq x+y \leq 1$).

Preferable Aspects of the Present Invention

Preferable aspects of the present invention will be supplementarily described hereafter.

(Supplementary Description 1)

According to an aspect of the present invention, there is provided a substrate for crystal growth used for a vapor phase growth of a crystal, wherein a plurality of seed crystal substrates made of a group III nitride crystal are arranged in a disc shape, so that their main surfaces are parallel to each other and adjacent lateral surfaces are in contact with each other; and the plurality of seed crystal substrates constituting at least a portion other than a peripheral portion (arc portion) of the substrate for crystal growth respectively has a main surface whose planar shape is a regular hexagon, and a honeycomb pattern obtained by matching the seed crystal substrates has two or more symmetries, when the substrate for crystal growth is rotated once, with an axis passing through a center of a main surface of the substrate for crystal growth and orthogonal to the main surface as a central axis.

(Supplementary Description 2)

Preferably, there is provided the substrate of the supplementary description 1, wherein the honeycomb pattern has three or more symmetries, more preferably six symmetries when the substrate for crystal growth is rotated in the same manner.

(Supplementary Description 3)

Preferably, there is provided the substrate of the supplementary description 1 or 2, wherein all lateral surfaces of the seed crystal substrates in contact with lateral surfaces of the adjacent seed crystal substrates are planes other than M-plane, and are the planes in the same orientation each other (equivalent planes).

(Supplementary Description 4)

Preferably, there is provided the substrate of the supplementary description 3, wherein all lateral surfaces of the seed crystal substrates in contact with lateral surfaces of the adjacent seed crystal substrates are a-planes.

(Supplementary Description 5)

Preferably, there is provided the substrate of any one of the supplementary descriptions 1 to 4, wherein the seed crystal substrate is formed by applying processing to a material substrate having a larger outer diameter than the seed crystal substrates;

lateral surfaces of the seed crystal substrates have melted planes or cut planes generated when forming scribe grooves on a back surface of the material substrate, and a cleavage plane generated on the side closer to the main surface of the seed crystal substrate than the melted plane or the cut plane when the material substrate is cleaved along the scribe grooves; and the adjacent seed crystal substrates are arranged so that at least the cleavage planes of the lateral surfaces thereof are in contact with each other.

(Supplementary Description 6)

Preferably, there is provided the substrate of any one of the supplementary descriptions 1 to 5, wherein the seed crystal substrates are fixed on a holding plate via an adhesive agent; and a surface layer of the holding plate is configured to peel off as a sacrificial layer when separating the seed crystal substrate from the holding plate.

(Supplementary Description 7)

Preferably, there is provided the substrate of the supplementary description 6, wherein the holding plate is made of at least one of pyrolytic graphite or pyrolytic boron nitride, or a composite material obtained by coating a surface of a flat plate made of any one of isotropic graphite, Si, quartz and SiC, with pyrolytic graphite or pyrolytic boron nitride.

(Supplementary Description 8)

Preferably, there is provided the substrate of the supplementary descriptions 6 or 7, wherein a linear expansion coefficient of the holding plate is equal to or smaller than a linear expansion coefficient of the seed crystal substrates.

(Supplementary Description 9)

Preferably, there is provided the substrate of any one of the supplementary descriptions 6 to 8, wherein the adhesive agent is made of a material that solidifies at a temperature lower than a growth temperature of a crystal grown on the seed crystal substrates, and withstands a growth temperature and a growth atmosphere of the crystal.

(Supplementary Description 10)

Preferably, there is provided the substrate of any one of the supplementary descriptions 6 to 9, wherein a linear expansion coefficient of the adhesive agent is equivalent to the linear expansion coefficient of the seed crystal substrates.

(Supplementary Description 11)

Preferably, there is provided the substrate of any one of the supplementary descriptions 6 to 10, wherein the adhesive agent is made of a material containing a heat-resistant ceramics and an inorganic polymer as main components, and more preferably the adhesive agent is made of a material containing at least one of zirconia or silica as a main component.

(Supplementary Description 12)

Preferably, there is provided the substrate of any one of the supplementary descriptions 6 to 11, wherein the adhesive agent is applied only to a region other than a peripheral portion of back surfaces of the seed crystal substrates, and more preferably to central portions of back surfaces of the seed crystal substrates.

(Supplementary Description 13)

Preferably, there is provided the substrate of any one of the supplementary descriptions 6 to 12, wherein an amount of the adhesive agent is an amount capable of preventing fixture and misalignment of the seed crystal substrates on the holding plate when growing a crystal on the substrate for crystal growth, and also an amount to make the adhesive agent in the solidified state broken or peeled off when a stress is applied to the substrate for crystal growth at the time of a temperature decrease due to a difference between a linear expansion coefficient of the substrate for crystal growth and the linear expansion coefficient of the holding plate, after crystal growth is carried out on the substrate for crystal growth.

(Supplementary Description 14)

Preferably, there is provided the substrate of any one of the supplementary descriptions 6 to 13, wherein recessed grooves are provided on a main surface of the holding plate to allow excess adhesive agent to escape when the seed crystal substrates are adhered onto the main surface of the holding plate.

(Supplementary Description 15)

According to another aspect of the present invention, there is provided a substrate for crystal growth having a crystal film made of a group III nitride crystal and used for a vapor phase growth of a crystal, which is formed into a disc shape; and which is configured so that the crystal film has a high defect region (high strain region) having a defect density (or internal strain) larger than an average defect density (internal strain) in the crystal film, the high defect region constitutes a honeycomb pattern in which outlines of regular hexagonal planar shapes are matched; and the honeycomb pattern has two or more symmetries when the substrate for crystal growth is rotated once, with an axis passing through a center of a main surface of the substrate for crystal growth and orthogonal to the main surface as a central axis.

Preferably, there is provided a substrate for crystal growth used for vapor phase growth of a crystal, including:

a plurality of seed crystal substrates made of a group III nitride crystal arranged in a disc shape so that main surfaces are parallel to each other and adjacent lateral surfaces are in contact with each other; and a crystal film grown on the seed crystal substrates, wherein the crystal film has a high defect region (high strain region) having a defect density (or internal strain) larger than an average defect density (internal strain) in the crystal film, under an influence of a combined part of the seed crystal substrates; and the high defect region constitutes a honeycomb pattern in which a main surface of a plurality of seed crystal substrates constituting at least a portion other than a peripheral portion respectively has a regular hexagonal planar shape; and the honeycomb pattern has two or more symmetries when the substrate for crystal growth is rotated once, with an axis passing through a center of a main surface of the substrate for crystal growth and orthogonal to the main surface as a central axis.

(Supplementary Description 16)

Preferably, there is provided the substrate of the supplementary description 15, having an outer diameter of 100 mm or more and configured to be freestanding.

(Supplementary Description 17)

Preferably, there is provided the substrate of the supplementary description 15 or 16, wherein a trace of sticking of residual components of an adhesive agent or a holding plate is left on a peripheral portion, more preferably on a central portion of a back surface of the seed crystal substrate.

(Supplementary Description 18)

According to further other aspect of the present invention, there is provided a nitride crystal substrate made of a group III nitride crystal, which is formed into a disc shape; and which is configured so that the nitride crystal substrate has a high defect region (high strain region) having a defect density (or internal strain) larger than an average defect density (internal strain) in the nitride crystal substrate, the high defect region constitutes a honeycomb pattern in which outlines of regular hexagonal planar shapes are matched; and the honeycomb pattern has two or more symmetries when the nitride crystal substrate is rotated once, with an axis passing through a center of a main surface of the nitride crystal substrate and orthogonal to the main surface as a central axis.

Preferably, there is provided a nitride crystal substrate made of a group III nitride crystal grown on the substrate for crystal growth of any one of the supplementary descriptions 1 to 17, wherein the nitride crystal substrate is formed into a disc shape;

the nitride crystal substrate has a high defect region (high strain region) having a defect density (or internal strain) larger than an average defect density (internal strain) in the nitride crystal substrate, under an influence of a combined part of the seed crystal substrates;

the high defect region constitutes a honeycomb pattern in which a main surface of the plurality of seed crystal substrates constituting at least a portion other than a peripheral portion respectively has a regular hexagonal planar shape; and the honeycomb pattern has two or more symmetries when the nitride crystal substrate is rotated once, with an axis passing through a center of a main surface of the nitride crystal substrate and orthogonal to the main surface as a central axis.

(Supplementary Description 19)

According to further other aspect of the present invention, there is provided a manufacturing method of a nitride crystal substrate, including the steps of:

preparing a substrate for crystal growth used for a vapor phase growth of a crystal through the step of arranging a plurality of seed crystal substrates made of a group III nitride crystal in a disc shape so that their main surfaces are parallel to each other and adjacent lateral surfaces are in contact with each other (steps 1 to 4); and fully-growing a crystal film by supplying a raw material and a nitriding agent on the heated substrate for crystal growth (step 5), wherein in the step of preparing the substrate for crystal growth, a substrate with a main surface having a regular hexagonal planar shape is used as a plurality of seed crystal substrates constituting at least a portion other than a peripheral portion of the substrate for crystal growth, and a honeycomb pattern in which the seed crystal substrates are matched, has two or more symmetries when the substrate for crystal growth is rotated once, with an axis passing through a center of the main surface of the substrate for crystal growth and orthogonal to the main surface as a central axis.

(Supplementary Description 20)

Preferably, there is provided the method of the supplementary description 19, wherein the step of preparing the substrate for crystal growth includes the steps of:

preparing an assembled substrate in which the plurality of seed crystal substrates are adhered onto a holding plate via an adhesive agent (steps 1 and 2);

supplying a raw material and a nitriding agent on the seed crystal substrates adhered onto the holding plate to grow a crystal film and combining the adjacent seed crystal substrates to the crystal film (step 3); and making the substrate for crystal growth in a freestanding state, the substrate for crystal growth being formed by combining the adjacent seed crystal substrates by the crystal film (step 4), wherein in the step of making the substrate for crystal growth in a freestanding state, the substrate for crystal growth and the holding plate are separated from each other by peeling a surface layer of the holding plate.

(Supplementary Description 21)

Preferably, there is provided the method of the supplementary description 20, wherein a material having a linear expansion coefficient equal to or smaller than a linear expansion coefficient of the seed crystal substrates is used for the holding plate. Preferably at least one of pyrolytic graphite or pyrolytic boron nitride, or a composite material obtained by coating a surface of a flat plate made of any one of isotropic graphite, Si, quartz and SiC, with pyrolytic graphite or pyrolytic boron nitride, is used for the holding plate.

(Supplementary Description 22)

Preferably, there is provided the method of the supplementary description 20 or 21, wherein the step of preparing the assembled substrate includes the step of arranging the plurality of seed crystal substrates on the holding plate via the adhesive agent, drying and solidifying the adhesive agent, and in the combining step, the assembled substrate in a state in which the adhesive agent is solidified is injected into a vapor phase growth apparatus to carry out crystal growth.

(Supplementary Description 23)

Preferably, there is provided the method of the supplementary description 22, wherein a material which solidifies at a temperature lower than a growth temperature of a crystal grown on the seed crystal substrates and withstands the growth temperature and growth atmosphere of the crystal is used as the adhesive agent. Preferably, a material having a linear expansion coefficient equal to a linear expansion coefficient of the seed crystal substrates is used as the adhesive agent. Preferably, a material containing a heat-resistant ceramics and an inorganic polymer as main components, for example, a material containing at least one of zirconia or silica as a main component is used as the adhesive agent.

(Supplementary Description 24)

Preferably, there is provided the method of the supplementary description 22 or 23, wherein the adhesive agent is applied only to a region other than a peripheral portion of back surfaces of the seed crystal substrates, and more preferably to central portions of back surfaces of the seed crystal substrates.

Further preferably, an amount of the adhesive agent is set to an amount capable of preventing fixture and misalignment of the seed crystal substrates on the holding plate when the crystal film is grown, and also an amount to make the adhesive agent in the solidified state broken or peeled off when a stress is applied to the substrate for crystal growth at the time of a temperature decrease due to a difference between a linear expansion coefficient of the substrate for crystal growth and the linear expansion coefficient of the holding plate.

(Supplementary Description 25)

Preferably there is provided the method of any one of the supplementary descriptions 20 to 22, wherein in the step of preparing the assembled substrate, the following steps are performed:

forming scribe grooves on a back surface side of a material substrate by irradiating the material substrate with a laser beam from a back surface side of an opposite side of a main surface of the seed crystal substrates, the material substrate being the substrate from which the seed crystal substrates are taken out, and obtaining the seed crystal substrates by cleaving the material substrate along the scribe grooves.

(Supplementary Description 26)

Preferably there is provided the method of the supplementary description 25, wherein when cleavage is performed by a plane other than M-plane, a depth of the scribe groove is set to a depth within a range of 60% or more and 90% or less of a thickness T of the material substrate. Preferably, when cleavage is performed by M-plane, a depth of the scribe groove is set to a depth within the range of 20% or more and 60% or less of the thickness T of the material substrate.

(Supplementary Description 27)

Preferably, there is provided the method of any one of the supplementary descriptions 19 to 26, wherein in the fully-growing step, the substrate for crystal growth which is in a freestanding state is placed directly on a susceptor and heated.

(Supplementary Description 28)

Preferably, there is provided the method of any one of the supplementary descriptions 20 to 27, wherein processing conditions are differentiated between the combining step and the fully-growing step so that in the combining step, a crystal growth along a surface direction of the seed crystal substrate becomes more active than a crystal growth along a surface direction of the seed crystal substrates in the fully-growing step; and in the fully-growing step, the crystal growth in a main surface direction of the seed crystal substrates become more active than a crystal growth in a main surface direction of the seed crystal substrates in the combining step.

(Supplementary Description 29)

Preferably, there is provided the method of the supplementary description 28, wherein a ratio of a partial pressure of $N_2$ gas to a partial pressure of $H_2$ gas in the fully-growing step is set to be smaller than a ratio of a partial pressure of $N_2$ gas to a partial pressure of $H_2$ gas in the combining step.

(Supplementary Description 30)

Preferably, there is provided the method of the supplementary description 28 or 29, wherein a film-forming temperature in the fully-growing step is set to be lower than a film-forming temperature in the combining step.
(Supplementary Description 31)

Preferably, there is the method of any one of the supplementary descriptions 28 to 30, wherein a ratio of a supply flow rate of a nitriding agent to a supply flow rate of a raw material gas in the fully-growing step is set to be larger than a ratio of a supply flow rate of the nitriding agent to a supply flow rate of a raw material gas in the combining step.

What is claimed is:

1. A substrate for crystal growth having a holding plate attached to a surface thereof, used for a vapor phase growth of a crystal,
    wherein a plurality of seed crystal substrates made of a group III nitride crystal are arranged in a disc shape, so that their main surfaces are parallel to each other and adjacent lateral surfaces are in contact with each other;
    the plurality of seed crystal substrates constituting at least a portion other than a peripheral portion of the substrate for crystal growth respectively has a main surface whose planar shape is a regular hexagon; and
    a surface of the seed crystal substrates are fixed on said holding plate through an adhesive agent, the holding plate has recessed grooves provided on a main surface of the holding plate and at positions facing positions where the lateral surfaces of the adjacent seed crystal substrates are in contact with each other, to allow the adhesive agent to escape.

2. The substrate for crystal growth according to claim 1, wherein all lateral surfaces of the seed crystal substrates in contact with lateral surfaces of the adjacent seed crystal substrates are planes other than M-plane, and are the planes in the same orientation each other.

3. The substrate for crystal growth according to claim 2, wherein all lateral surfaces of the seed crystal substrates in contact with lateral surfaces of the adjacent seed crystal substrates are a-planes.

4. The substrate for crystal growth according to claim 1, wherein a surface layer of the holding plate is configured to peel off as a sacrificial layer when separating the seed crystal substrate from the holding plate.

5. The substrate for crystal growth according to claim 4, wherein the holding plate is made of pyrolytic graphite, or a composite material obtained by coating a surface of a flat plate made of any one of isotropic graphite, Si, quartz and SiC, with pyrolytic graphite.

6. The substrate for crystal growth according to claim 1, wherein a linear expansion coefficient of the holding plate is equal to or smaller than a linear expansion coefficient of the seed crystal substrate.

7. The substrate for crystal growth according to claim 1, wherein the adhesive agent is made of a material containing a heat-resistant ceramic and an inorganic polymer as main components, and is made of a material that solidifies at a temperature lower than a growth temperature of a crystal grown on the seed crystal substrates and withstands a growth temperature and a growth atmosphere of the crystal.

8. The substrate for crystal growth according to claim 1, wherein the adhesive agent is made of a material containing a heat-resistant ceramic and an inorganic polymer as main components, and a linear expansion coefficient of the adhesive agent is equivalent to the linear expansion coefficient of the seed crystal substrates.

9. The substrate for crystal growth according to claim 4, wherein the adhesive agent is applied only to a center of a back surface of each seed crystal substrate.

10. The substrate for crystal growth according to claim 1, wherein an amount of the adhesive agent is an amount capable of preventing fixture and misalignment of the seed crystal substrates on the holding plate when growing a crystal on the substrate for crystal growth, and also an amount to make the adhesive agent in the solidified state broken or peeled off when a stress is applied to the substrate for crystal growth at the time of a temperature decrease due to a difference between a linear expansion coefficient of the substrate for crystal growth and the linear expansion coefficient of the holding plate, after crystal growth is carried out on the substrate for crystal growth.

11. The substrate for crystal growth according to claim 1, wherein the recessed grooves are provided on the main surface of the holding plate and at positions facing all peripheral portions of each of the all seed crystal substrates constituting the substrate for crystal growth.

12. The substrate for crystal growth according to claim 1,
    wherein the seed crystal substrate is formed by applying processing to a material substrate having a larger outer diameter than the seed crystal substrates;
    lateral surfaces of the seed crystal substrates have melted planes or cut planes generated when forming scribe grooves on a back surface of the material substrate, and a cleavage plane generated on the side closer to the main surface of the seed crystal substrate than the melted plane or the cut plane when the material substrate is cleaved along the scribe grooves;
    a ratio of an area of the melted planes or the cut planes to an area of the lateral surface of the seed crystal substrate is 60% or more and 90% or less, and a ratio of an area of the cleavage planes to an area of the lateral surface of the seed crystal substrate is more than 10% and less than 40%; and
    the adjacent seed crystal substrates are arranged so that at least the cleavage planes of the lateral surfaces thereof are in contact with each other, and the seed crystal substrates are arranged respectively so that the cleavage planes are arranged on the crystal growth surface side.

* * * * *